US006194244B1

(12) United States Patent
Yamaguchi et al.

(10) Patent No.: US 6,194,244 B1
(45) Date of Patent: Feb. 27, 2001

(54) METHOD OF MANUFACTURING A PHOTODIODE IN A SOLID-STATE DEVICE

(75) Inventors: Tetsuya Yamaguchi; Hisanori Ihara, both of Yokohama (JP); Hirofumi Yamashita, Cambridge, MA (US); Hidetoshi Nozaki, Yokohama; Ikuko Inoue, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/109,061

(22) Filed: Jul. 2, 1998

(30) Foreign Application Priority Data

Jul. 4, 1997 (JP) .................................................. 9-179928
Jul. 14, 1997 (JP) .................................................. 9-188726

(51) Int. Cl.[7] .................................................. H01L 21/00
(52) U.S. Cl. .............................. 438/57; 438/48; 438/57; 257/10
(58) Field of Search ........................ 438/57–98, 48; 257/10

(56) References Cited

U.S. PATENT DOCUMENTS 5,754,280 * 5/1998 Kato et al. ........................... 356/3.06
5,920,092 * 7/1999 Watanabe ............................. 257/292

* cited by examiner

Primary Examiner—Matthew Smith
Assistant Examiner—G. Lee
(74) Attorney, Agent, or Firm—Oblon, Spivak, McClelland, Maier & Neustadt, P.C.

(57) ABSTRACT

The solid-state image sensor comprises a semiconductor substrate, a plurality of photoelectric conversion sections formed within respective isolated active regions on the semiconductor substrate, an image area wherein unit cells comprising the plurality of photoelectric conversion sections and a signal scanning circuit are arranged in a two-dimensional array form, and signal lines for reading signals from the respective unit cells within the image pick-up area, wherein the respective photoelectric conversion sections being formed by at least twice ion implantation.

8 Claims, 15 Drawing Sheets

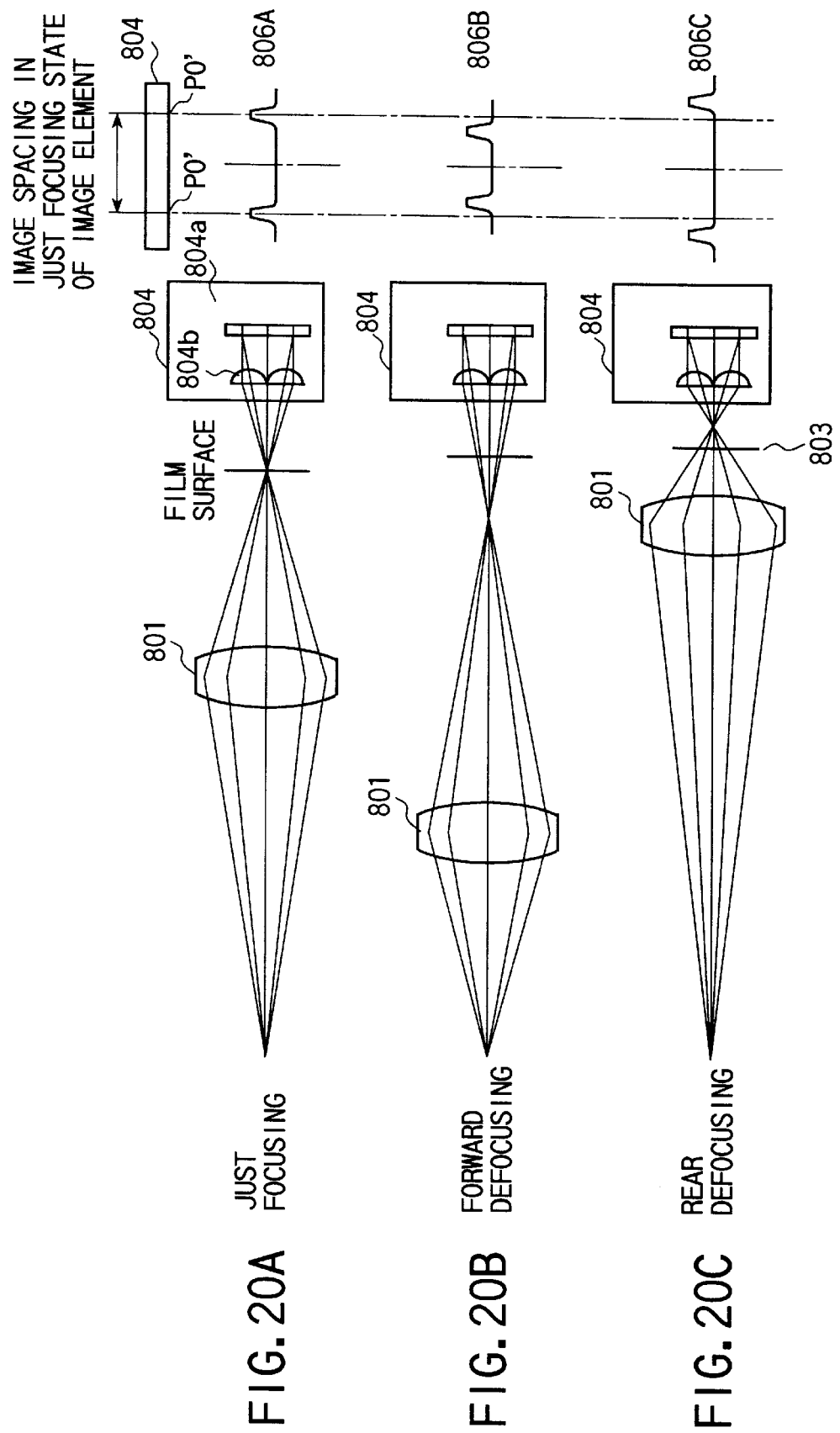

METHOD OF MANUFACTURING A PHOTODIODE IN A SOLID-STATE DEVICE

BACKGROUND OF THE INVENTION

The present invention relates to a solid-state image sensor, and a manufacturing method thereof.

Prior art in the field will be described, referring to the drawing.

FIG. 1 is a view of an example of a circuit of a solid-state image sensor called an amplifying MOS sensor.

In FIG. 1, amplifying transistors 2 for reading a signal from a photodiode 1 and 3×3 unit cells comprising a reset transistor 3 for resetting a signal charge are arranged in a two-dimensional form. In reality, more unit cells than those shown in FIG. 1 are arranged. Horizontal address lines 5 extending in the horizontal direction from a vertical shift resistor 4 are connected to the gates of vertical select transistors, and specify the line for reading signals. Reset lines 6 are connected to the gates of the reset transistors. The sources of the amplifying transistors 2 are connected to vertical signal lines 7, and the one end of each of the lines 7 is connected to a load transistor 8. The other thereof is connected to a horizontal signal line 11 through a horizontal select transistor 10 to be selected by a select pulse supplied from a horizontal shift resistor 9.

In a conventional method for forming a photodiode 1 in a photoelectric conversion section (see FIG. 2), a p-well (p-type layer) 12 is formed on a Si substrate 13, and a resistor 14 is applied onto the Si substrate at other than the portion where the photodiode 1 is to be formed, to carry out patterning. Subsequently, phosphorus 15 (P) is implanted thereto by ion implantation at one time. After that, thermal treatment is conducted to form the photodiode 1. The distribution of impurity concentration is shown in FIG. 3.

FIG. 3 shows the distribution of phosphorus (P) concentration, which is for forming the photoelectric conversion section, the distribution of boron (B) concentration, which is for forming the p-well, and the distribution of net impurity concentration. Such a sort of device has the following disadvantages:

(1) Carriers in a sufficient amount which are generated by photoelectric conversion cannot be stored, since the capacity of the photodiode 1 is small.

(2) Carrier generated in the deep position in the substrate by photoelectric conversion leak into the photodiodes for adjacent pixels so as to result in mixed colors.

(3) The area for collecting the carrier in the photodiode is small and consequently sensitivity is low.

In the case of implanting a great deal of an ion in the conventional method, ion damage is concentrated into a certain depth (for example, near 0.2 $\mu$m) so that dark current increases.

As described above, the conventional MOS-type solid-state image sensor has the disadvantages of small capacity of the photodiode, mixed color, low sensitivity and generation of a dark current in a large amount.

BRIEF SUMMARY OF THE INVENTION

The object of the invention is to provide a solid-state image sensor which has a large photodiode-capacity and a high sensitivity and causes no mixed colors and dark current in a small amount; a method of manufacturing the same; and various sorts of devices to which the solid-state image sensor is applied.

To overcome the aforementioned disadvantages, the present invention is as follows:

The solid-state image sensor according to the present invention comprises a semiconductor substrate; a plurality of photoelectric conversion sections formed within respective isolated active regions on the semiconductor substrate; an image area wherein unit cells comprising the plurality of photoelectric conversion sections and a signal scanning circuit are arranged in a two-dimensional array form; and signal lines for reading signals from the respective unit cells within the image pick-up area, wherein the respective photoelectric conversion sections being formed by at least twice ion implantation.

Preferred manners of the solid-state image sensor are as follows:

(1) An area of the vicinity of a surface portion of the plurality of photoelectric conversion sections is larger than that of a deep portion of the plurality of photoelectric conversion sections.

(2) The active regions are isolated by an insulator element isolation.

(3) In the first and second ion implantation steps for forming the photoelectric conversion sections sorts of implanted ions are different or energies for implantation are different.

The method of manufacturing the solid-state image sensor according to the invention, wherein the solid-state image sensor comprises a plurality of photoelectric conversion sections formed within respective isolated active regions on a semiconductor substrate; an image pick-up area wherein unit cells comprising the plurality of photoelectric conversion sections and a signal scanning circuit are arranged in a two-dimensional array form; and signal lines for reading signals from the respective unit cells within the image region, comprises the step of forming the a plurality of photoelectric conversion sections by at least twice ion implantation.

According to the invention, the photodiodes for the photoelectric conversion sections can be formed to be positioned deeply in the deep direction of the substrate, since ion implantation is carried out at least two times. As a result, the area for collecting carriers in the photodiodes is spread in the deep direction of the substrate, thereby improving sensitivity. The degree of color crosstalks can be reduced since carriers leaking into adjacent pixels can be reduced. It is also possible to increase joint capacitance produced at the side wall portion of adjacent pixels. Ion implantation is separately carried out several times, so that areas subjected to ion damage (mainly, near the portion where ions are stopped) can be dispersed. Thus, the ion damage can be easily recovered in a subsequent annealing step, and dark current is reduced.

The following advantages are obtained according to the present invention.

The photodiodes for the photoelectric conversion sections can be formed to be positioned deeply in the deep direction of the substrate. As a result, the area for collecting carriers in the photodiodes is spread in the deep direction of the substrate, thereby improving sensitivity. The degree of color crosstalks can be reduced since carriers leaking into adjacent pixels can be reduced. It is also possible to increase joint capacitance produced at the side wall portion of adjacent pixels. Ion implantation is separately carried out several times, so that areas subjected to ion damage (mainly, near the portion where ions are stopped) can be dispersed. Thus, the ion damage can be easily recovered in a subsequent annealing step, and dark current is reduced.

Application of the present invention to, in particular, a MOS-type solid-state image sensor is very useful; however, application of the invention to any CCD other than the MOS-type solid-state image sensor also provides all advantageous effects except decrease in dark current.

The solid-state imaging system according to the invention comprises an optical system for receiving an optical image from an object to introduce the optical image onto a specified position; an image processor having a sensor for converting the optical image introduced onto the specified position into electric signals corresponding to -the quantity of the light of the optical image, for every pixel unit; and a signal processor for processing the outputs from the image processor into a desired format to output the processed signals, wherein the sensor having: a semiconductor substrate; a plurality of photoelectric conversion sections formed within respective isolated active regions on the semiconductor substrate; an image region wherein unit cells comprising the plurality of photoelectric conversion sections and a signal scanning circuit are arranged in a two-dimensional array form; and signal lines for reading signals from the respective unit cells within the image pick-up area; the respective photoelectric conversion sections being formed by at least twice ion implantation.

Preferred manners of this solid-state imaging system is as follows.

(1) The area of the vicinity of the surface portion of the plurality of photoelectric conversion sections is larger than that of the deep portion of the photoelectric conversion sections.

(2) The active regions are isolated by insulator element isolations.

(3) The firs and second ion implantation steps for forming the photoelectric conversion sections sorts of implanted ions are different or energies for implantation are different.

The aforementioned solid-state imaging system according to the invention makes it possible to provide a compact MOS-type solid-state image sensor application system which can realize saving energy and a high quality image.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 20A to 20C are views for explaining the principle of adjusting the focus in the auto-focus mechanism.

DETAILED DESCRIPTION OF THE INVENTION

Figure 1:
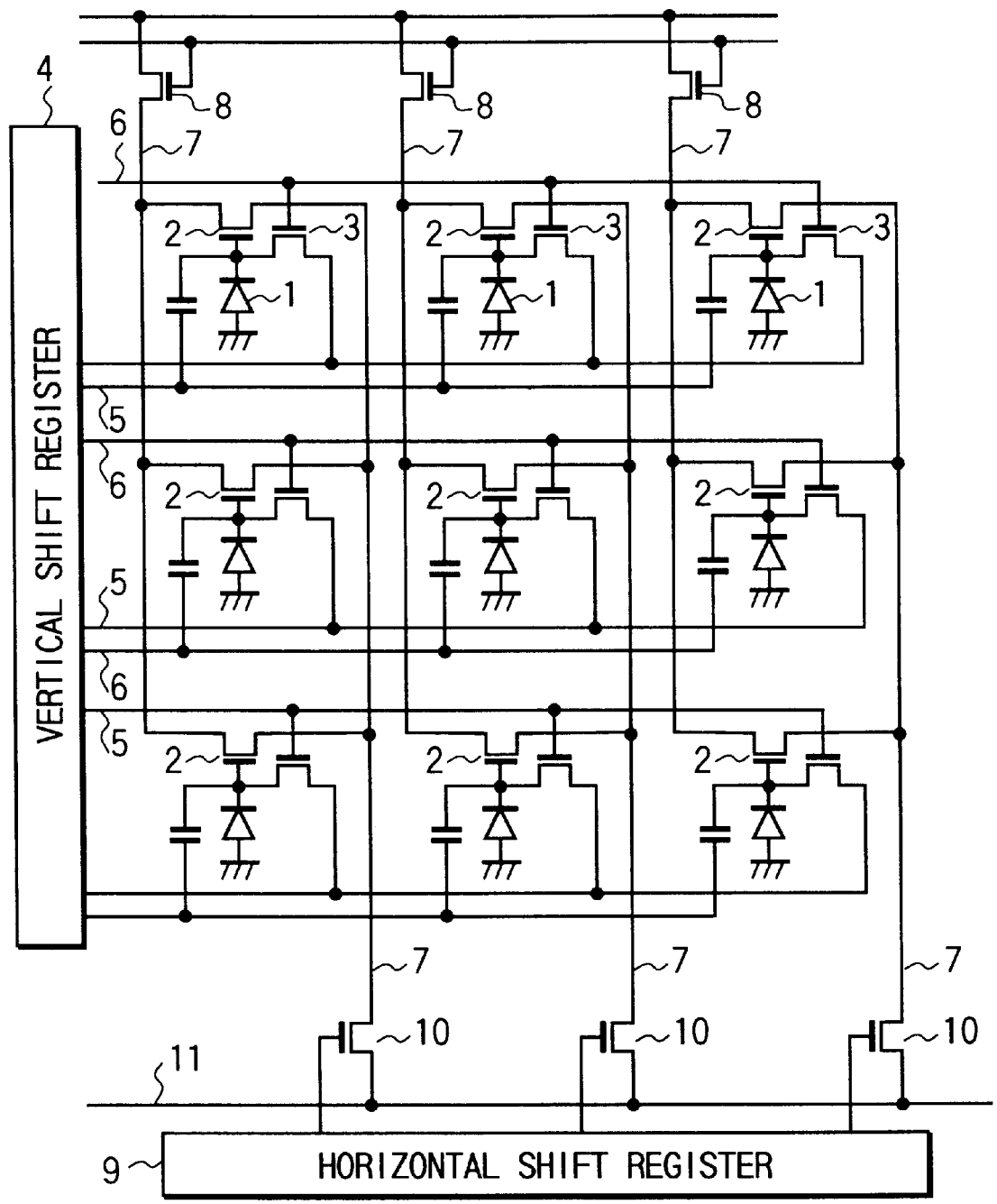
FIG. 1 is a view of a circuit of a sensor in the prior art.
Figure 2:
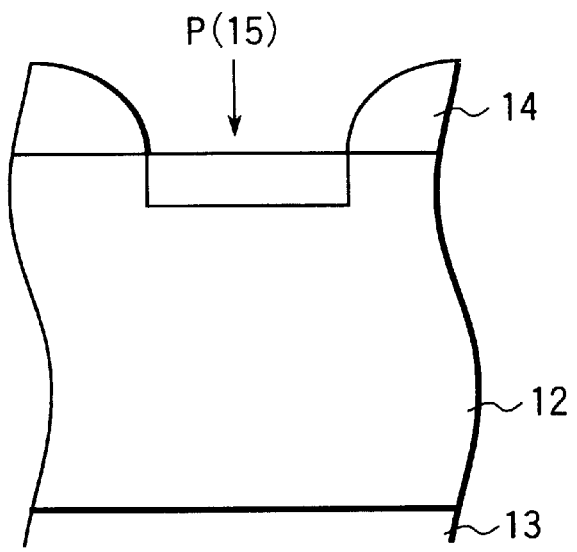
FIG. 2 is a cross sectional structure of a conventional photodiode.

Embodiments of the present invention will be described below, referring to the drawings.

As the following embodiments, MOS-type solid-state image sensor will be described; however the present invention can be applied to any CCD.

Figure 4:
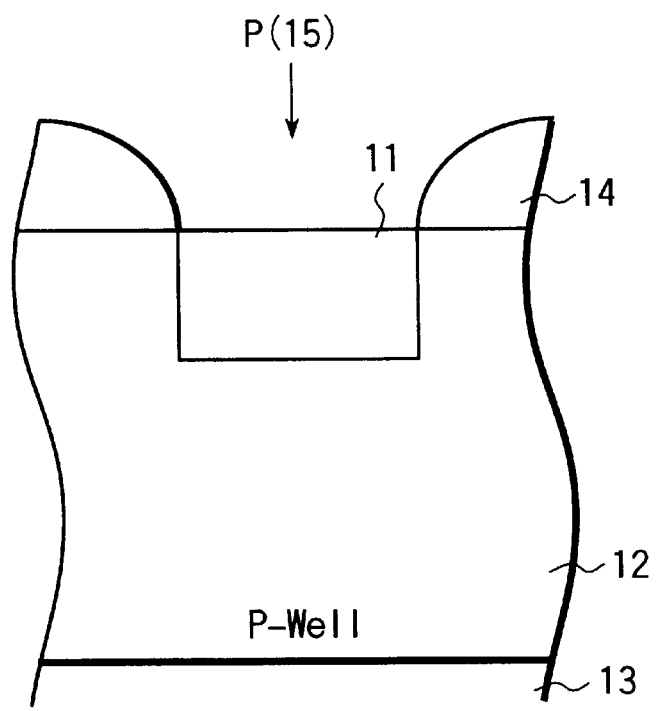
FIG. 4 is a cross section of the structure of a photodiode in the present invention.

FIG. 4 is a cross section of the structure of a photodiode in the solid-state image sensor in the present invention, in the process for producing the photodiode.

A p-type layer 12 (p-well) is formed on a p-type silicon substrate 13, and then patterning is carried out so as to apply a resist 14 onto other than portions where photodiodes are to be formed. Into the substrate, phosphorus 15 (P) is implanted by ion implantation method.

In case of carrying out ion implantation in the present invention, the photodiode 11 is formed by ion implantation at least two times. Specifically, the formation of the photodiode by ion implantation two times will be described, referring to FIGS. 5A and 5B, which are a top view of a part of the element and a 5B—5B cross section in FIG. 5A, respectively.

An element isolation film is made of an insulator by, for example, LOCOS process to isolate respective element areas. Ion is implanted into the element area to form a photodiode. In the present invention, a photodiode is formed as follows.

In the first ion implantation, phosphorus is implanted at an energy of 90 keV and a quantity of light for exposure of $1.2\times10^{12}$ cm$^{-3}$. The second implantation is performed at a higher energy than that in the first implantation, for example, at an energy of 140 keV and an implantation amount of $7\times10^{12}$ cm$^{-3}$. In this case, about the condition for P ion implantation in the second ion implantation, it is preferred that the energy of ion is made higher than that for the first ion implantation and/or the exposure is made lower than that for the first ion implantation. In this case, it is also preferred that in the first and second ion implantation processes masks are changed so that the width of the photodiode by the second ion implantation will be narrower than that by the first ion implantation. For example, in the first ion implantation the photodiode is apart at a distance of 0.2 $\mu$m from the end face by LOCOS, and in the second ion implantation the photodiode is further apart at 0.2 $\mu$m.

After that, in annealing process the substrate is annealed at, for example, 900° C. for 30 minutes to activate the implanted ion. Thus, a photodiode is formed.

After forming the photodiode by the aforementioned process, the surface of Si is made flat (formation of an insulating film) by a known method and then is wired to finish a solid-state image sensor.

Figure 3:
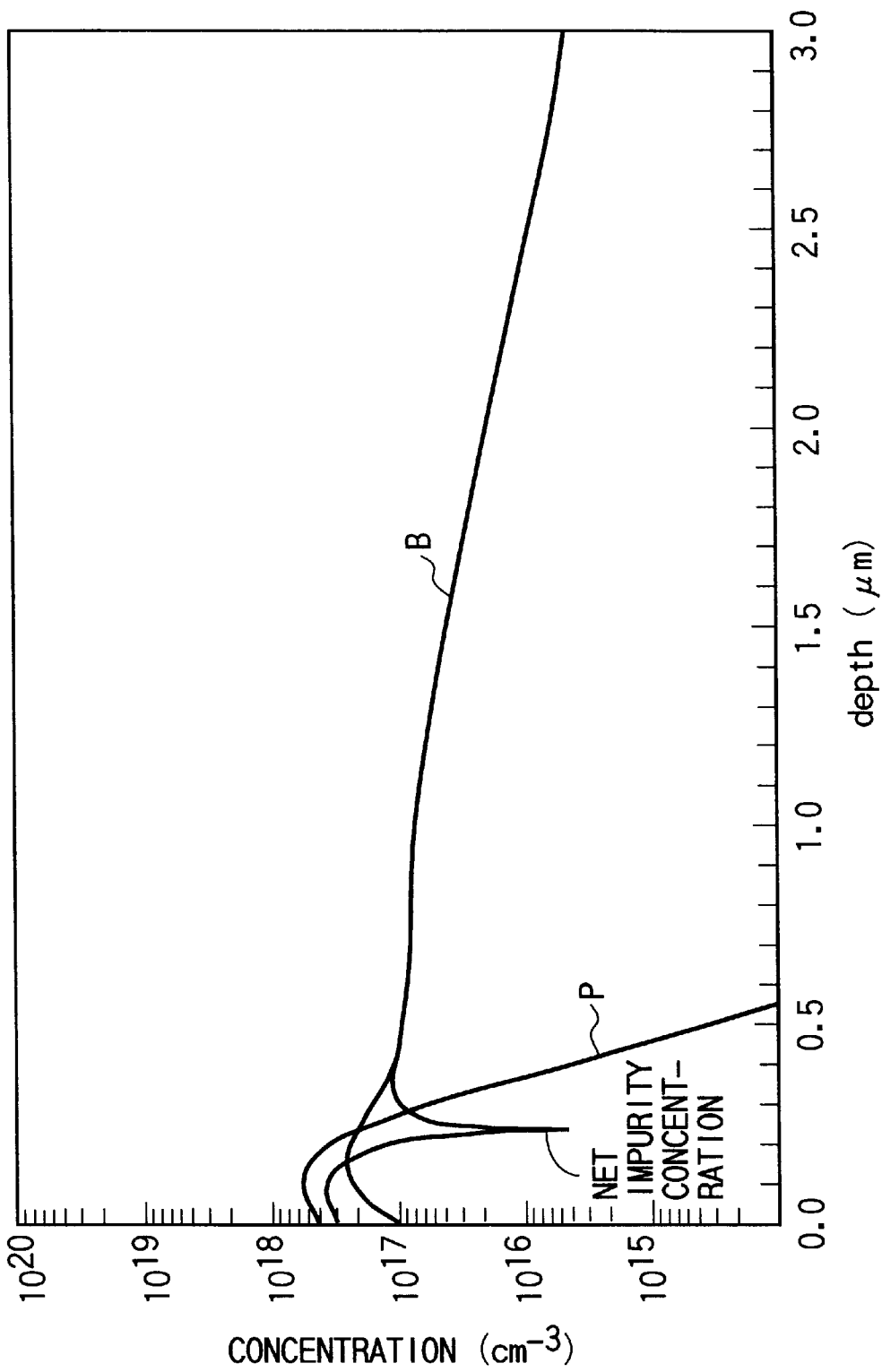
FIG. 3 shows the distribution of impurity concentration along the depth direction in the conventional photodiode.
Figure 6:
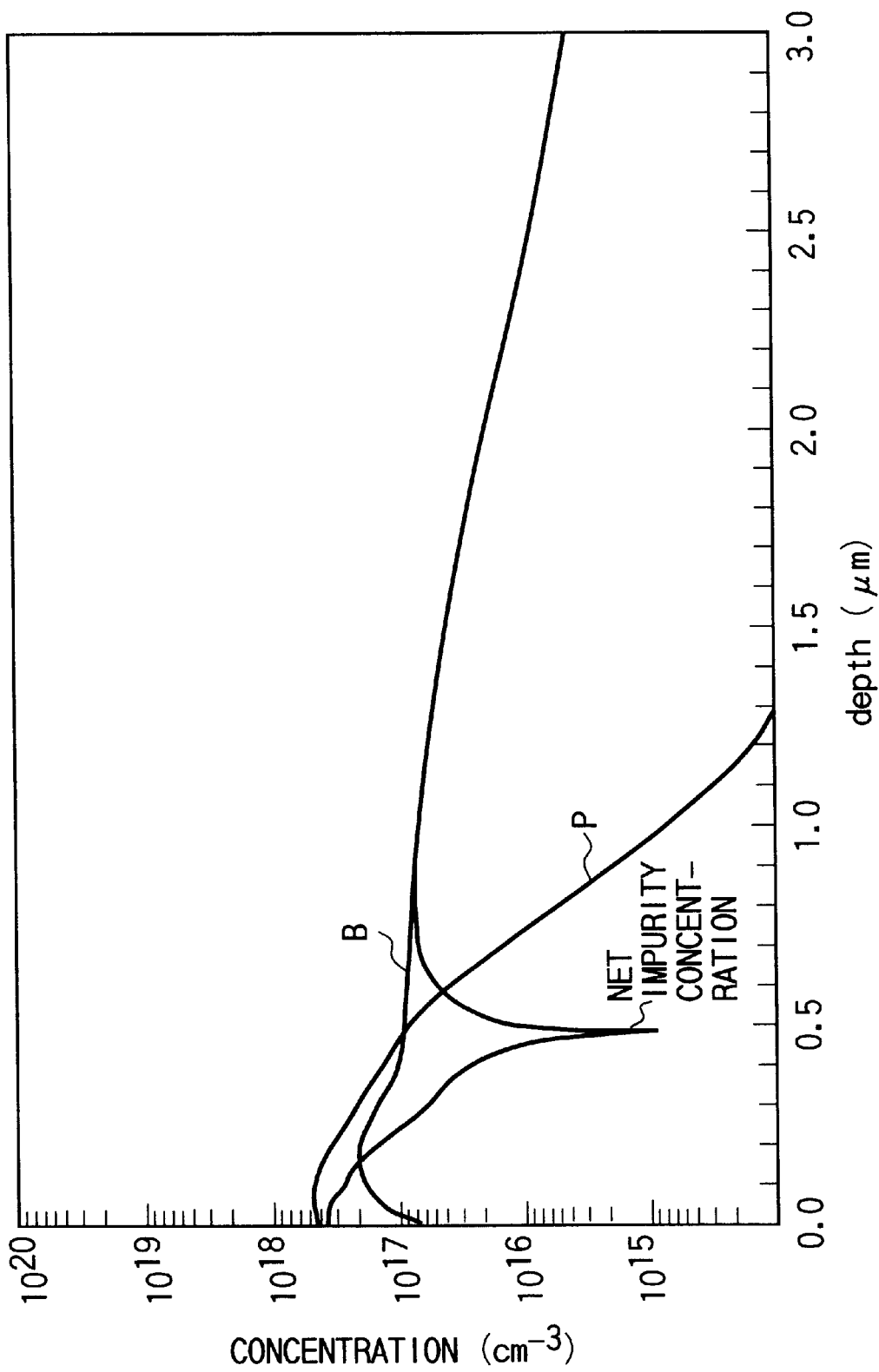
FIG. 6 shows the distribution of impurity concentration along the depth direction in the photodiode in the present invention.

According to the present invention, for formation of the photodiode, ion implantation is performed at least two times as described above, so that the photodiode 11 can be formed to be positioned deeply in the substrate. As shown in FIG. 6, by performing ion implantation, for example, two times at different energies and quantities of light for exposure, it is possible to make the distribution of impurity concentration of phosphorus, which is for forming the photodiode 1, more smooth along the depth direction of the substrate, than the prior art (see FIG. 3). In this case, it is important that the ion implantation condition in the second ion implantation is decided so that two or more peaks of impurity concentration are not be made.

This is because in reading process a potential pocket is generated in the photodiode if the peaks of impurity concentration are made. As a result, a signal charge is stored in the pocket so that the signal in that portion cannot be read. This results in after-image and the disadvantage that sensitivity is lowered. Therefore, it is necessary to make only one peak of impurity concentration.

As described above, the photodiode is formed by ion implantation two more times in the present invention although it is formed by ion implantation at one time in the prior art. In this manner, the photodiode can be formed to deep points.

Figure 5A:
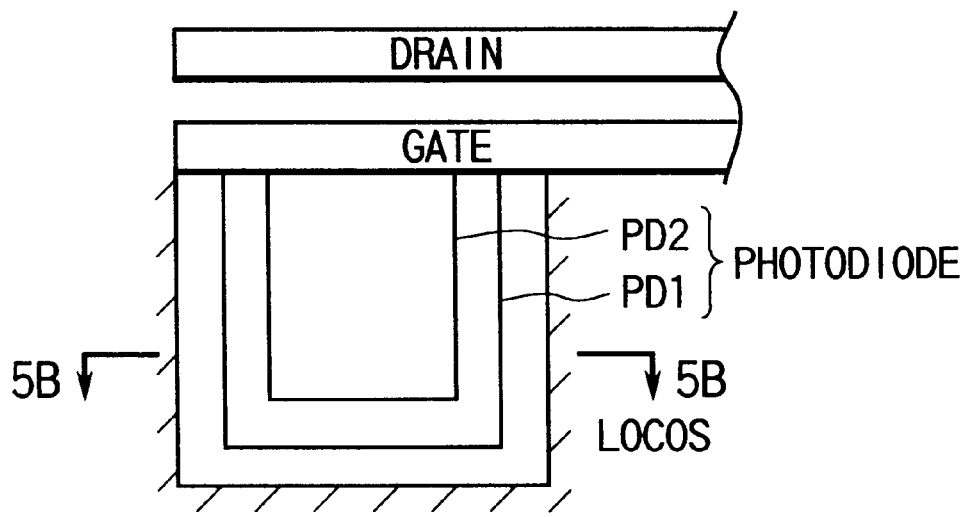
FIGS. 5A and 5B are a top view and a cross section of the photodiode in the present invention, respectively.
Figure 5B:
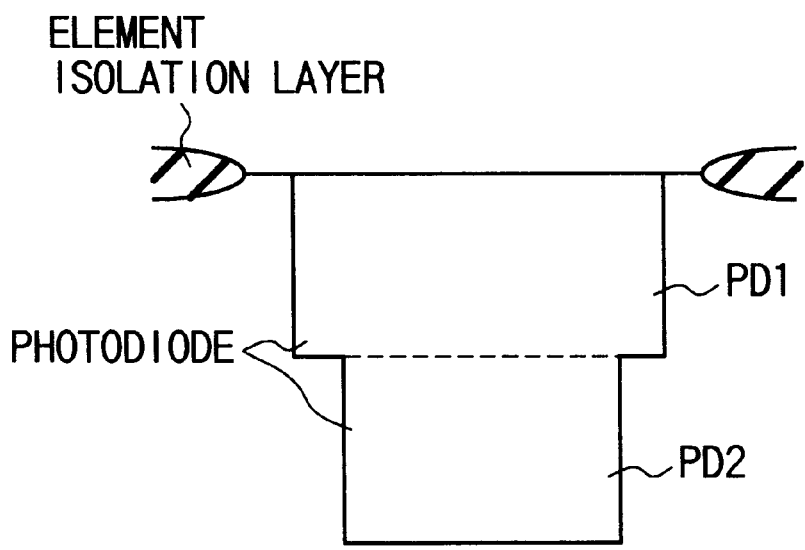

When the size of the photodiode is compared between its upper portion (the vicinity of the surface) and its lower portion, it is understood as shown in FIGS. 5A and 5B that the photodiode is made to be narrow at the deep position. This is because it is known that in the case of isolating elements by, for example, LOCOS process, defects are arisen along the direction at about 57 degrees obliquely downwards from the end of the element isolation film. When the lower area of the photodiode is large, the lower portion contacts the defects arisen by LOCOS so that a dark current increases, causing drop in the performance of the element. In the present invention the area of the lower portion of the photodiode is made smaller than that of the upper portion thereof so as to avoid direct contact of the defects with the photodiode, not causing the aforementioned disadvantage.

When such distribution of impurity concentration as in the photodiode structure of the present invention is produced by the prior art process (i.e., the process using only once ion implantation), the amount of ion for implantation must be increased to diffuse the ion to the deep position of the substrate. Besides, the ion is activated and damaged ion is recovered in annealing process so that the ion is also diffused to the surface side of the substrate. Thus, the surface is turned into an n-type. In the prior art, it is also impossible to form such a photodiode whose deep portion is narrower as in the present invention. Since the photodiode formed by the prior art is shallow, it is difficult to implant boron on the substrate after phosphorus ion implantation to make the surface of the photodiode into a p-type.

When such a photodiode as according to the present invention is formed by the prior art, the disadvantage is caused that damage is concentrated at a local point because the quantity of light for exposure becomes larger. The ion damage is caused by separation of Si—Si bonds. Since unbounded Si generated by ion damage can become a center for generating a dark current, a further disadvantage that dark current increases can be caused. Ion species spread out in the lateral direction of the substrate (in a two-dimensional direction), and consequently it is disadvantageous to make the element fine. In short, it is impossible to form the same distribution of impurity concentration as in the photodiode according to the present invention by the prior art (ion implantation at one time).

An advantage of the present invention is that the points which are subjected to ion damage are dispersed by carrying out ion implantation two or more times at, for example, different energies, so that ion damage can be easily recovered in subsequently annealing process. For formation of a photodiode, ion implantation is performed two or more times in such a manner as in the present invention so that the photodiode becomes deeper than the photodiode produced by the prior art. Thus, the junction capacitance of the photodiode increases correspondingly to the increase in the depth. The photodiode is formed to expand to the deep position of the substrate; therefore, the area which is capable of collecting carriers (electrons) in the photodiode also expands to the deep position of the substrate. As a result, the sensitivity of the photodiode is improved.

Color crosstalk is defined as the ratio of carriers leaking into adjacent pixels (adjacent photodiodes) to carriers collected in the photodiodes which are irradiated with light.

Color crosstalk=(carriers in adjacent pixels)/(carriers in pixels irradiated with light)

By forming a photodiode so as to expand to the deep position, it is possible to increase the number of carriers which can be collected in the photodiode. As a result, color crosstalks can be reduced.

The present embodiment relates to an example of an n-type photodiode, but the present invention can be applied to the formation of a photodiode whose surface is a p-type.

The above-mentioned embodiment relates to a MOS-type solid-state image sensor. However, the method of manufacturing a photodiode by ion implantation two or more times according to the present invention is also applied to not only the MOS-type solid-state image sensor but also a CCD. When the present invention is applied to a CCD, similarly it is possible to improve sensitive, increase capacity, reduce color crosstalks and disperse damage caused by ion implantation.

The following embodiments relate to a system using the aforementioned solid-state image sensor. In the following description, the aforementioned solid-state image sensor according to the present invention is referred to as a solid state image element to avoid confusion.

For solid state image elements in the prior art, a CCD is in general used.

Figure 7:
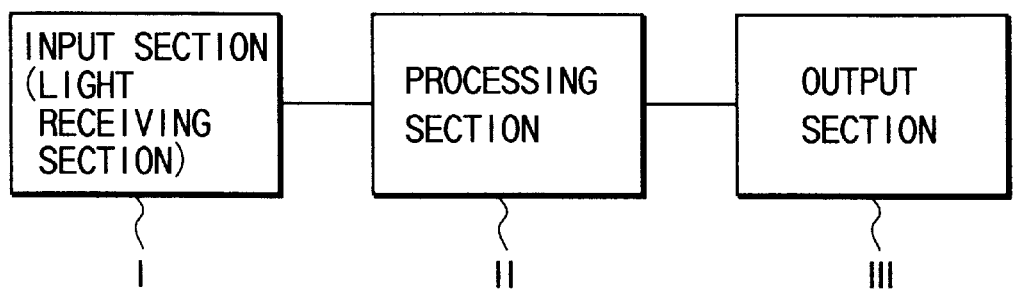
FIG. 7 is a view showing a basic structure of a solid-state image sensor according to the present invention.

As shown in FIG. 7, the basic structure of a solid state image element has an input section I, a processing section II and an output section III. The input section I is a light-receiving section. In the light-receiving section I, a plurality of photodiode, each of which constitutes a pixel, are arranged so that the respective pixels output electric signals correspondingly to the quantity of received light. The processing section II is a section for reading the signals from the respective pixels in turn, and may have a noise canceling function. The output section III is a circuit for outputting the signals read from the respective pixels. In the case of a CCD sensor, generally plural driving power sources are needed and saving energy is difficult. If it is driven by a battery, a power source circuit having a large scale is needed to generate plural sorts of voltages. On the contrary, a MOS sensor has an advantage that it can be driven by a single power source.

Referring to FIG. 7, an embodiment using a MOS sensor instead of a CCD will be described. High sensitivity and a low degrees of color crosstalks can be attained by making the MOS sensor (which is referred to as a MOS sensor or an amplifying MOS sensor but includes a "CCD sensor") into such a structure as in the aforementioned embodiment.

A MOS sensor according to the present invention is a MOS sensor having m×n pixel-layout in which photodiodes whose number is (m×n) are arranged in a matrix from, and comprises a light receiving section (input section) wherein (m×n) photodiodes are arranged, a processing section having a reading section for reading signals in turn from the respective photodiodes constituting the light receiving section, and an output section for outputting the signals read by the processing section.

The processing section has the reading section as described above. The MOS sensor according to the present invention may have a noise chancellor circuit, which takes out signals separately at the timing for taking out only noise components and at the timing for taking out signal components including noise components so as to cancel the noise components and obtain signal components not effected by noises. The noise chancellor circuit is preferably made so as to match the impedance when only noise components are outputted and the impedance when noise and signal components are outputted with each other, thereby canceling noises accurately.

If a MOS sensor is used as a solid state image element, a sensor section for photoelectric conversion in the MOS sensor and other circuits (an IV conversion circuit, an AGC circuit, a CLP circuit and an ADC circuit) can be produced by using usual MOS processes. Thus, these circuits can be easily mounted on the same semiconductor chip. This makes it possible to realize saving energy, and drive a video camera and the like by a single voltage so as to make the power supply circuit simple and drivability by a battery easy.

The following will describe various systems to which a MOS-type solid state image element which has a high S/N ratio and can realize low electric power and voltage to be consumed, and drivability by a simple power supply is applied.

Figure 8:
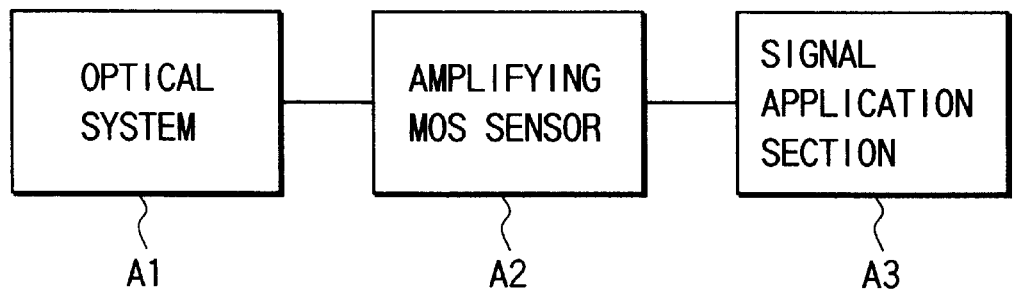
FIG. 8 is a view showing a common structure of a device using a MOS sensor as an image detecting section.

FIG. 8 illustrates a general structure of the device using a MOS sensor as an image detecting section.

As illustrated in FIG. 8, the present device is composed of an optical system A1, an amplifying MOS sensor A2 and a signal application section A3. The optical system A1 is a system for introducing an optical image into the amplifying MOS sensor A2 and specifically is composed of an appropriate combination, dependent on a purpose, of a lens, a prism, a pinhole, a dichroic mirror, a light collecting optical fiber, a concave mirror, a convex mirror, a color filter, a shutter mechanism, an iris mechanism and the like.

The amplifying MOS sensor A2 is a device for converting the optical image introduced with the optical system Al into image signals corresponding to the quantity of light of the optical image, and outputting only signal components.

The signal application section A3 is a device for processing the output from the amplifying MOS sensor A2 dependently on the used system. In the case where the system is, for example, a video camera, the signal application section A3 is an application section, e.g., for converting the image signal outputted from the amplifying MOS sensor A2 into a complex image signal in a PAL or NTSC system.

The amplifying MOS sensor A2 can be driven by a single power supply, and uses a photodiode as a light receiving section for converting light into an electric signal. The photodiode corresponds to a pixel. A plurality of photodiodes are arranged in a matrix form in the same manner as in the prior art, but use of the photodiodes according to the present invention makes it possible to obtain an amplifying MOS sensor having a high sensitivity and causing only a low degree of color crosstalks.

If the amplifying MOS sensor A2 is made into a structure which will be described later, it is possible to obtain such an output having no 1/f noises that its voltage amplitude is about 10 mV or less and its output current is about 1 $\mu$A or more. The dynamic range of the outputs from the amplifying MOS sensor A2 is also improved up to 70 dB or more, which is similar to the dynamic range of CCD sensors. The dynamic range is still more improved up to 90 dB, which is similar to that of silver salt films by appropriate signal-processing.

As a result, it is possible to realize various systems using a single power supply and an amplifying MOS sensor having a high sensitivity as an image sensor (image sensor), and to provide an application device using an amplifying MOS-type solid-state image sensor (amplifying MOS sensor) which can realize low electric power and voltage to be consumed and further have a good S/N ratio.

Figure 9:
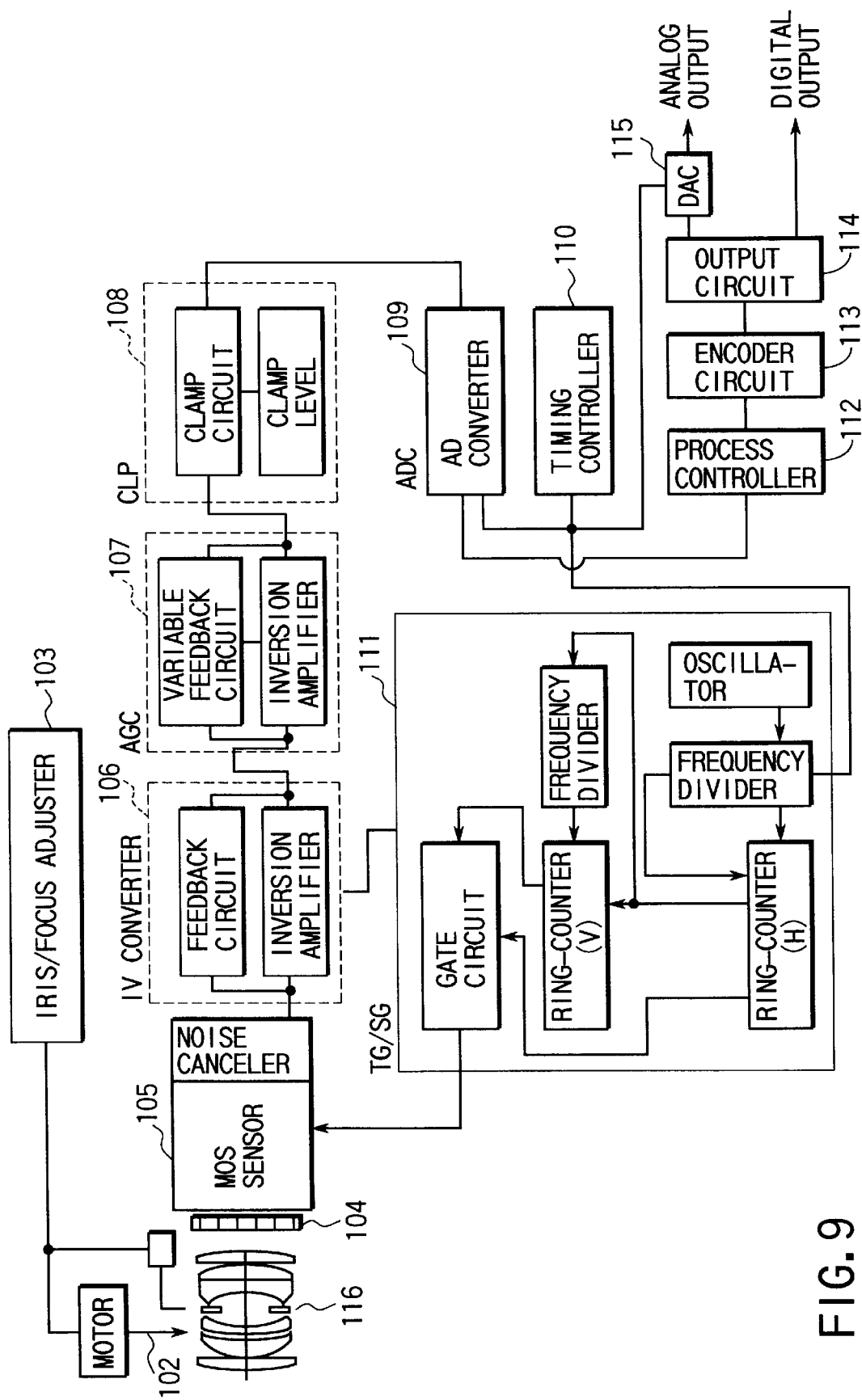
FIG. 9 is a view showing the structure of an embodiment of a video camera using a MOS sensor according to the present invention.

The following will describe an embodiment wherein the amplifying MOS sensor is applied to a video camera. FIG. 9 illustrates an embodiment of a video camera using a MOS sensor according to the present invention.

As illustrated in FIG. 9. The video camera 100 according to the present invention has a lens 101 which is an optical element for taking in the image of an object, a focus adjusting mechanism 102 for adjusting the focus of the optical element, an iris/focus adjuster 103 for controlling an iris mechanism 116 for adjusting the quantity of light incident on the optical system and the focus adjusting mechanism 102, a MOS sensor 105, which is an image element for converting the optical image formed with the lens 101 into electric signals corresponding to the quantity of light of the optical image, for every pixel, a color filter array 104 which is arranged at the image forming face side of the MOS sensor 105 and has either one of R, G or B color filter for every pixel, a current/voltage converter 106 for converting the current signal from the MOS sensor 105 into a voltage signal, an AGC circuit 107 for adjusting a level of the voltage signal obtained through the current/voltage converter 106, a clamp circuit 108 (CLP) circuit for clamping the voltage signal whose level is adjusted through the AGC circuit 107, an AD converter (ADC) 109 for converting the output from the CLP 108 into a digital signal corresponding to the level of the output, a timing controller 110 for generating timing pulses (clock signals) for setting timing for basic operation of the system, a TG/SG circuit 111 for controlling the drive of the MOS sensor 105 in synchronization with the clock signals outputted from the timing controller 110, a process controller 112 for processing the digital signal outputted from the AGC 109, an encoder circuit 113 for encoding the signal processed with the process controller 112, an output circuit 114 for outputting the encoded signal, and a DA converter 115 for converting the signal outputted through the output circuit 114 into an analog signal.

In the video camera 100 having the aforementioned structure, the light from an object goes forward to the MOS sensor 105 through the lens 101, and then the incident light is converted into an electric signal by photoelectric conversion to output an electric current. The color filter array 104 in which color filters of red, blue and green colors are regularly arranged correspondingly to the respective pixels is formed on the MOS sensor 105, and by means of the array color image signals corresponding to three primary colors are outputted, as electric signals, from each of the MOS sensors 105.

The electric signals outputted from the MOS sensor 105 are supplied through the current/voltage converter 106, the AGC circuit 107 and the CLP circuit 108 to the ADC circuit 109.

The ADC circuit 109 converts the image signals from the CLP circuit 108 into digital data (1 sampled data being composed of, for example, 8 bits) and supplies the digital data to the process controller 112.

The process controller 112 comprises, for example, a color separating circuit, a clamp circuit, a gamma correction circuit, a white clipping circuit, a black clipping circuit, a Knee circuit and the like. The supplied image signals are subjected to necessary processing by the process controller 112. If necessary, color balance processing is also conducted. The signals processed by the process controller 112 are supplied to the encoder circuit 113.

In the encoder circuit 113, operations are carried out using the supplied signals so as to convert the signals into brightness signals and color difference signals. In the case of transmitting the video camera output through a network or the like, the encoder circuit 113 converts the signals into complex image signals in a PAL, NTSC, or the like system.

The timing of the MOS sensor 105 and the current/voltage converter 106 is controlled by timing signal and synchronizing signals from the TG/SG (timing generator/signal generator) circuit 111. The power supply level for operating the TG/SG circuit 111 and the output voltage level from the TG/SG circuit 111 are equal to the power supply level for supplying the MOS sensor 105.

After that, the image signals are given through the output circuit 114 to the D/A converter 115, and the D/A converter 115 converts the inputted signals into analog video signals and outputs them as camera signals. The image signals can be also outputted directly as digital signals through the output circuit 114. These camera signals are supplied to a recording device or a monitor device such a videotape recorder.

The present embodiment makes it possible to obtain high sensitivity and high quality image signals having a low degree of color crosstalks and a high S/N ratio in a video camera, which requires low electric power and voltage to be consumed and the image-processing of 30 frames of images per second.

Figure 10:
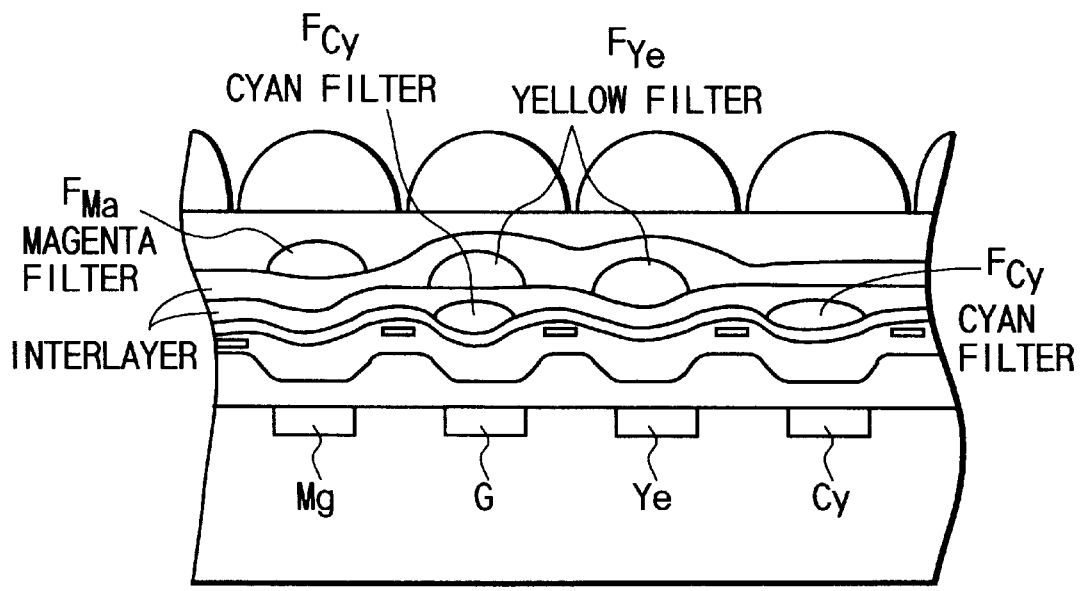
FIG. 10 is a cross section illustrating an embodiment of a MOS image sensor having a structure in which a color filter array and a MOS sensor are put in a body.

In the present embodiment, the structure of the color filter array 104 and that of the MOS sensor 105 which is an image sensor are separated. In the case of, for example, CCD devices, however, there have been known many examples in which an image sensor and a color filter are put into a body. Thus, the color filter array 104 and the MOS sensor 105 put into a body may be used. The image sensor in which the color fitter array 104 and the MOS sensor 105 are put into a body may be the structure as shown in FIG. 10.

Specifically, many minute photodiodes PD are arranged on a semiconductor substrate Sub in a matrix form. On the light receiving face of the respective photodiodes PD, a lightproof film, which is a light shielding mask, Mst in which the light receiving areas of the respective photodiodes are opened is formed from, for example, aluminum. Thereon, a transparent smoothing film Mft is formed and then thereon cyan filters $F_{Cy}$, magenta filters $F_{Mg}$ and Yellow filters $F_{Ye}$ are formed.

The photodiodes PD are separated into the photodiodes Mg for magenta images, ones G for green images, ones Ye for yellow images, and ones Cy for cyan images. The cyan filters $F_{Cy}$, the magenta filters $F_{Mg}$ and the yellow filters $F_{Ye}$ are formed on the light receiving faces of the photodiodes for green and cyan images, on the light receiving faces of the photodiodes for magenta images, and the light receiving faces of the photodiodes for yellow images, respectively. On the resultant, a transparent overcoat layer Oc is formed, and then thereon a microlens array Lmc is formed. The microlens array Lmc is an array wherein many minute lenses are arranged so that the respective minute lenses are positioned on the light receiving faces of the photodiodes PD. The microlens array Lmc ensures the quantity of light incident on the photodiodes PD to improve the detecting sensitivity of the photodiodes PD.

When such an image sensor with which the color filters are integrated is used as an image element (the MOS sensor 105 in FIG. 9) for a single plate type imaging system, it is unnecessary to set color filters separately and it is possible to omit matching the position of color filters to respective pixels on the light receiving face of the MOS sensor 105. Thus, the space for optical systems can be also saved.

Figure 11:
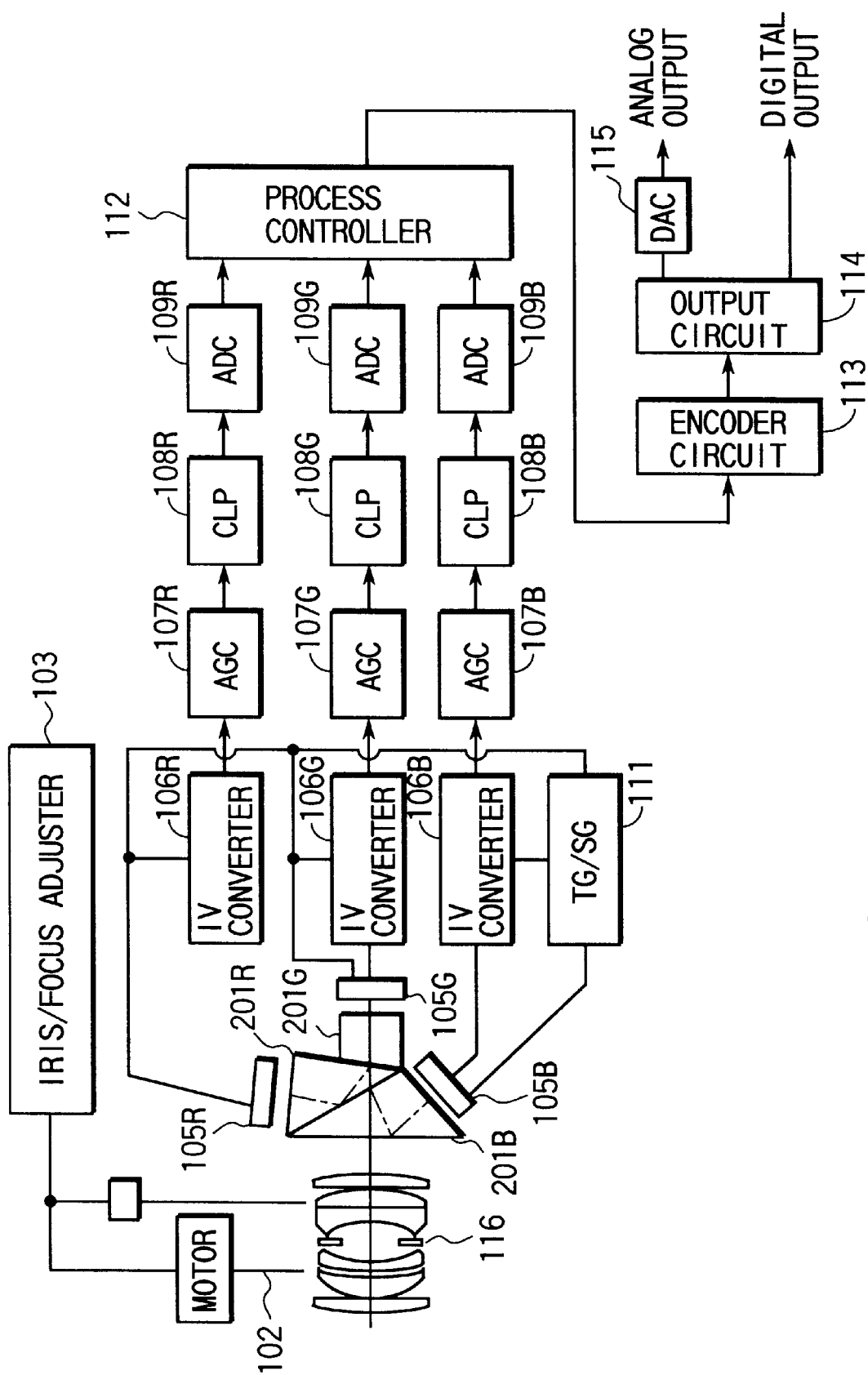
FIG. 11 is a view illustrating a structure of a video camera of another embodiment using a MOS sensor according to the present invention.

The following will describe another embodiment wherein an amplifying MOS sensor is applied to a video camera. FIG. 11 shows an embodiment of another video camera using a MOS sensor according to the present invention. The embodiment shown in FIG. 11 is not an example of a single plate type imaging system such as the one in FIG. 9, but an example of a triple-plate type video camera wherein image systems are separated into 3 systems for R, G and B (red, green and blue).

As shown in FIG. 11, the video camera 100-2 according to the present invention has a lens 101 which is an optical element for taking in the image of an object; a focus adjusting mechanism 102 for adjusting the focus of the optical element; an iris/focus adjuster 103 for controlling an iris mechanism 116 for adjusting the quantity of light incident on the optical element and the focus adjusting mechanism 102; color decomposing prisms 201R, 201G and 201B for decomposing the optical image taken in by the lens 101 into components of three primary colors of R, G and B; MOS sensors 105R, 105G and 105B for R components, G components and B components, respectively, which are image elements on which light of the three primary-color images decomposed by the color decomposing prisms 201R, 201G and 201B forms an image to convert the optical image into an electric signal corresponding to the quantity of light of the optical image, for every pixel; current/voltage converters 106R, 106G and 106B for the R component system, the G component system and B component system, respectively, which convert the electric signals obtained by the MOS sensors 105R 105G and 105B into voltage signals; AGC circuits 107R, 107G and 107B for the R component system, the G component system and B component system, respectively which are for adjusting a level of the voltage signals obtained by the current/voltage converters 106R, 106G and 106B; clamp circuits (CLP) circuits 108R, 108G and 108B for the R component system, the G component system and B component system, respectively which are for clamping the voltage signal whose level is adjusted through the AGC circuits 107R, 107G and 107B; AD converters (ADC) 109R, 109G and 109B for the R component system, the G component system and B component system, respectively which are for converting the outputs from the CLPs 108R, 108G and 108B into digital signals corresponding to the level of the outputs; a timing controller 110 for generating timing pulses (clock signals) for setting timing for basic operation of the system; TG/SG circuits 111 for the R component system, the G component system and B component system, respectively which are for controlling the drive of the MOS sensors 105 in synchronization with the clock signals outputted from the timing controller 110, a process controller 112 for processing the digital signals outputted from the ADCs 109R, 109G and 109B; an encoder circuit 113 for encoding the signal processed with the process controller 112; an output circuit 114 for outputting the encoded signal; and a DA converter 115 for converting the signal outputted through the output circuit 114 into an analog signal.

In the video camera 100-2 having the aforementioned structure, the light from an object goes through the lens 101 and the color decomposing prisms 201R, 201G and 201B and forms an image on the MOS sensors 105R, 105G and 105B.

The color decomposing prisms 201R, 201G and 201B are prisms for decomposing an optical image into components of the three primary colors. Each component of the image light decomposed into the primary colors R, G and B by the color decomposing prisms 201R, 201G and 201B forms an image on the corresponding MOS sensor 105R, 105G or 105B.

The optical image of each of the R, G and R components which is formed on the MOS sensor 105R, 105G or 105B is converted into an electric signal to output an electric current corresponding to brightness, in the MOS sensor 105R, 105G or 105B.

The electric signal of each component which is outputted from the MOS sensor 105R, 105G or 105B is supplied through the current/voltage converter 106R, 106G or 106B, the AGC circuit 107 R, 107G or 107B and the CLP circuit 108R, 108G or 108B to the ADC circuit 109R, 109G or 109B.

The ADC circuit 109R, 109G or 109B for each component converts the image signal from the CLP circuit 108 into digital data (1 sampled data being composed of, for example, 8 bits) and supplies the digital data to the process controller 112.

The process controller 112 comprises, for example, a gamma correction circuit, a white clipping circuit, a black clipping circuit, a Knee circuit and the like. The supplied image signals are subjected to necessary processing by the process controller 112. If necessary, color balance processing is also conducted. The signals processed by the process controller 112 are supplied to the encoder circuit 113. In the encoder circuit 113, operations are carried out using the supplied signals, and then the signals are subjected to, e.g., color balance processing. In the case of transmitting the video camera output through a network or the like, the encoder circuit 113 converts the signals into complex image signals in a PAL, NTSC, or the like system, which is a standard television broadcasting system.

The timing of the MOS sensors 105R, 105G and 105B and the current/voltage converter 106R, 106G and 106B is controlled by timing signal and synchronizing signals from the corresponding TG/SG (timing generator/signal generator) circuit 111. The power supply level for operating the TG/SG circuit 111 and the output voltage level from the TG/SG circuit 111 are equal to the power supply level for supplying the MOS sensor 105.

After that, the image signals are given through the output circuit 114 to the D/A converter 115, and the D/A converter 115 converts the inputted signals into analog video signals and outputs them as camera signals. The image signals can be also outputted directly as digital signals through the output circuit 114. These camera signals are supplied to a recording device or a monitor device such a videotape recorder.

The present embodiment makes it possible to obtain high sensitivity and high quality image signals having a low degree of color crosstalks and a high S/N ratio in a video camera, which requires low electric power and voltage to be consumed and the image-processing of 30 frames of images per second.

In the present embodiment, an optical image is decomposed into components of the three primary colors by using the color decomposing prisms. However, a dichroic mirror may be used for this. Incident light is separated and distributed with dichoric mirrors, for example, for reflecting red, green and blue light so as to decompose the optical image into each of the R, G and B components. The optical image is received in the MOS sensors for R, G and B images to obtain an image signal for each of R, B and G images. In this case, the optical image can be obtained as a signal of each component of the three primary colors, without use of any prism.

Figure 12:
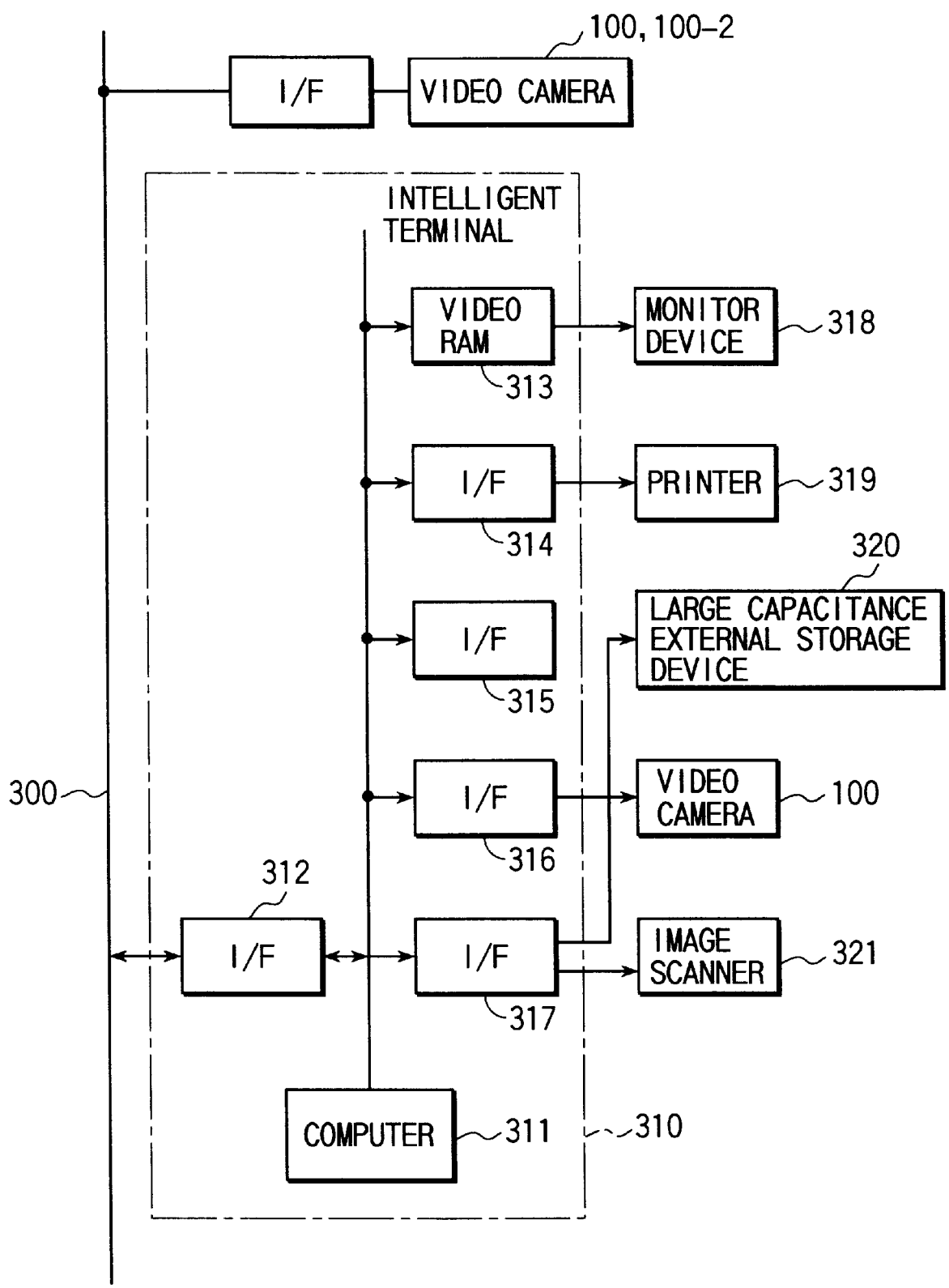
FIG. 12 is a view for explaining a network system to which an amplifying MOS sensor according to the present invention is applied.

The following will describe an embodiment wherein an amplifying MOS sensor is applied to a network system. FIG. 12 illustrates an example of a system structure for transmitting signals from the aforementioned video camera 100 or 100-2 through a network into a monitor device or the like.

In FIG. 12, a network 300 may be any one, for example, a LAN (a local area network), a public line (a telephone circuit), an exclusive line, an internet or an intranet. The video camera 100 or 100-2 is connected to the network 300 through an interface 301.

An intelligent terminal 310 corresponds to a personal computer or a work station. The intelligent terminal 310 has a computer body 311 including a processor or a main memory and a clock generator, an interface 312 for connection with the network, a video RAM 313, which is a memory for displaying images, a printer interface 314, standard bus interfaces 315 and 317 such as SCSI (Small computer System Interface), an interface 316 for connection with a video camera, and the like. These are connected to each other with internal buses. A monitor device 318 such as a CRT monitor or a liquid crystal display is connected to the video RAM 313. A printer 319 is connected to the printer interface 314. A large capacity external memory 320 such as an optical disk device, a hard disk device or a DVD (Digital Video Disk) is connected to the standard bus interface 317. To the standard bus interface 317, an image scanner 321 is also connected, which is for taking in images from, for example, a hard copy. To the interface 316 for connection to a video camera, for example, the video camera 100 explained in the above-mentioned embodiment is connected.

In this structure, the image of an object obtained by shooting the object with the video camera 100 or 100-2 is processed, in the encoder circuit 113, to be converted into digital signals image-compressed in the MPEG system for transmitting video camera outputs. The complex image signals are transmitted, as digital signals and in a transmitting format for a network, through the interface 301 into the network 300. To the network 300, the intelligent terminal 310 is connected through the interface 312. If the data transmitted from the video camera 100 or 100-2 are addressed to the intelligent terminal 310, the computer body 311 of the intelligent terminal 310 takes in the transmitted data through the interface 312 from the network 300. The computer body 311 extracts image information portion from the transmitted data. In the video camera 100 or 100-2, the image signals have been compressed. Thus, the computer body 311 expands the image signals to be restored to their original image data. The original image data are written in the video RAM 313 in turn. The original images are animation. Thus, the image data in the video RAM 313 are renewed one after another. As a result, the animation transmitted from the video camera 100 or 100-2 are displayed on the monitor device 318 for displaying the images based on the image data in the video RAM 313.

The image of an object obtained by shooting the object with the video camera 100 or 100-2 is processed in the encoder circuit 113 to be converted into digital signals image-compressed in the MPEG system for transmitting video camera outputs through a network or the like, as described above. After that, the data are outputted through the interface 316 into the computer body 311, and then are expanded in the computer body 311 to be restored to three document image data. The original image data are written in the video RAM 313 in turn. The original images are animation. Thus, the image data in the video RAM 313 are renewed one after another. As a result, the animation transmitted from the video camera 100 or 100-2 are displayed on the monitor device 318 for displaying the images based on the image data in the video RAM 313.

When the computer body 311 transmits the images from the video camera 100 or 100-2 connected to the intelligent terminal 310 into the network 300, the computer body 311 edits the image data into a transmitting format for the network and outputs them through the interface 312 into the network 300.

Figure 13:
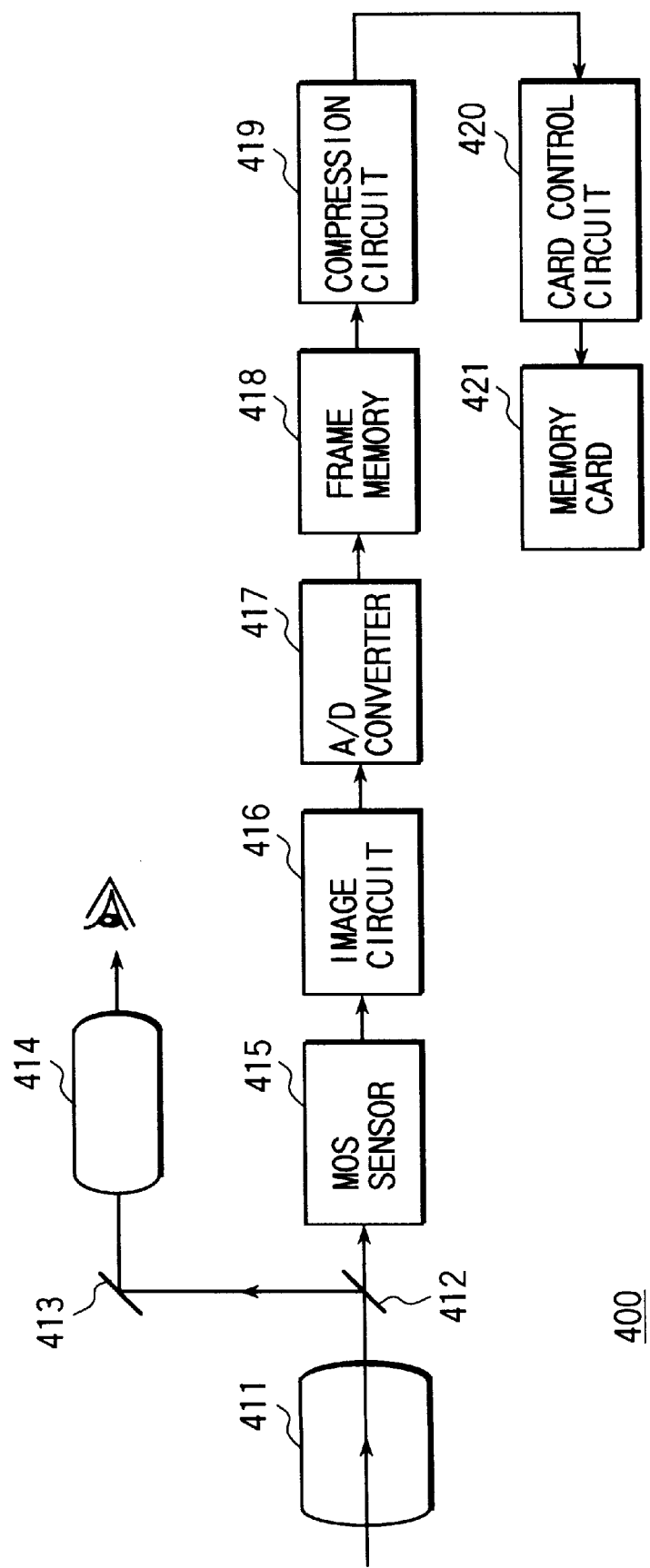
FIG. 13 is a view for explaining a camera to which an amplifying MOS sensor according to the present invention is applied.

The following will describe an embodiment wherein an amplifying MOS sensor is applied to a camera. FIG. 13 illustrates an embodiment of a camera using a MOS sensor according to the present invention.

As shown in FIG. 13, the camera 400 according to the invention has an optical system 411 for taking in image light of an object, including a lens system and an iris, a MOS sensor 415 on which the image light taken in by the optical system 414 forms an image, and a mirror 412 positioned between the image forming face of the MOS sensor 415 and the optical system 411 to be freely put on and taken off from the light path between them. When the mirror 412 is put on the light path, the mirror 412 distributes the image light of the object taken in by the optical system 411 into a finder 414 and when the mirror 412 is taken off from the light path, the mirror 412 has a function of a shutter for making the image light taken in by the optical system 411 form an image on the image forming face of the MOS sensor 415. The camera also has a mirror 413 for introducing the reflect light on the mirror 412 into the finder 414, an image circuit 416 for reading respective color components of the image signals from the MOS sensor 415 separately, an A/D converter 417 for converting the read outputs into digital signals, a frame memory 418 for storing the digital signals converted by the A/D converter 417, correspondingly to every picture (i.e., in every picture unit), a compression circuit 419 for compressing the digital signals stored in the frame memory 418, correspondingly to every picture, a memory card 421 for storing image data, and a card control circuit 420 for carrying out control for writing the image data obtained by compression in the compression circuit 419 on the memory card 421.

In this structure, a shutter button not illustrated is operated so that the image light of an object taken in by the optical system 411 forms an image on the MOS sensor 415. The MOS sensor 415 is a solid state image element according to the present invention. When the image light taken in by the optical system 411 forms an optical image, the MOS sensor 415 converts the optical image into an electric signal which corresponds to the quantity of the light of the optical image 411, for every pixel unit. In order to take color images, on the image forming face of the MOS sensor 415 a color filter array having either one of R, G or B color filter portion per every pixel is disposed. The image circuit 416 separately outputs respective R, G and B color components of the electric signal obtained from the MOS sensor 415. The current/voltage converter 106 converts the electric signal based on each of different color components which is outputted from the image circuit 416 into a digital signal and then the digital signal obtained by the conversion is temporarily stored in the frame memory 418, in every picture unit.

The digital signal stored in the frame memory 418 is compressed in the compression circuit 419, in every picture unit, and then is outputted into the card control circuit 420. The card control circuit 420 carries out control for storing the compressed image data in the memory card 412, which is a medium for storing data.

In this manner, every time when the shutter button is operated, a still image taken with the camera is compressed and stored in the memory card 412, in every picture unit. The memory card 421 can be put on and taken off from the camera. The memory card 412 is put on a reproducing device not illustrated, and then the image data are expanded to be restored to their original so as to display them on the monitor device or output a hard copy by a hard copy device such as a video printer. Thus, the image stored in the memory card 421 can be enjoyed.

According to the present invention, a compact camera can be obtained which makes it possible to reduce the electric power and voltage to be consumed and realize a high-speed photographing such that plural frames of photographs are successively taken for a second, with a high S/N ratio and which has high function and performance. Namely, it is possible to provide a camera with which a high quality photograph with a high sensitivity, a low degree of color crosstalks and a good S/N ratio can be taken.

Figure 14:
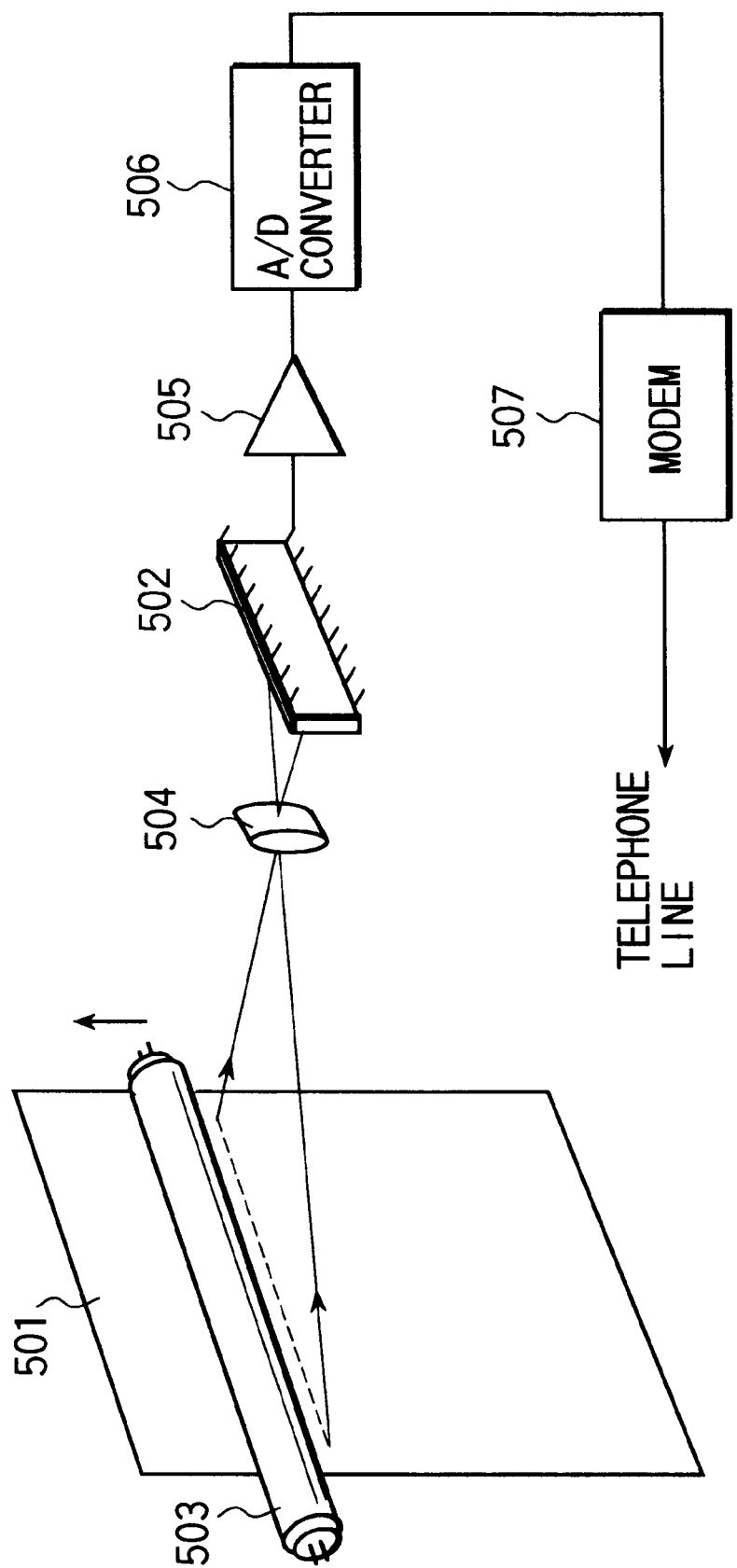
FIG. 14 is a view illustrating an embodiment of a facsimile using a MOS sensor according to the present invention.

The following will describe an embodiment wherein an amplifying MOS sensor is applied to a facsimile. FIG. 14 illustrates an embodiment of a facsimile using a MOS sensor according to the present invention.

FIG. 14 shows a principal structure of the facsimile. While a document 501 in a sheet form, for example, a document wherein an image is handwritten or printed on paper, or a photograph is fed in a main scanning direction (in the arrow B direction) with the main feeding mechanism not shown, the image information on the document is read by a MOS sensor 502 which is fixed onto a position and arranged along the traverse direction of the document. Reference numbers 503 and 504 show a light source and a lens for forming light from the image on the document into an image on the light receiving face of the MOS sensor 502, respectively.

The MOS sensor 502 is a linear sensor wherein light receiving bodies (photodiodes) for respective pixel units are arranged in a one-dimensional form, and is a monochrome solid-state image sensor according to the present invention.

When the document 501 in a sheet form is set on the present facsimile, the document 501 is fed in the main scanning direction (in the arrow B direction) with the main feeding mechanism not illustrated. Light from the image on the document forms an image, through the lens 540, on the light receiving face of the MOS sensor 502 fixed on a specified position, one line by one line. The MOS sensor 502 reads the formed image information from the document.

Specifically, the MOS sensor 502 reads an image signal corresponding to the quantity of received light, in the order that pixels are arranged, in every pixel unit and outputs it, and then an amplifier 505 amplifies the signals in the order that they are outputted. After that, the amplified image signals are converted into digital signals by an A/D converter 506 and then modulated into signals for the telephone circuit in a modem 507 so as to output them into the telephone circuit.

At a receiver, the received signals are demodulated and then, in the order that the signals are received, images having a density corresponding to the received signal are printed in the traverse direction of a recording paper fed in the main scanning direction, so that the original image is reproduced as a hard copy.

According to the present invention, a compact facsimile can be obtained which makes it possible to reduce the electric power and voltage to be consumed and realize a high-speed reading with a high S/N ratio and which has high function and performance. Namely, it is possible to provide a facsimile wherein a high quality image with a high sensitivity, a low degree of color crosstalks and a good S/N ratio can be sent at a high-speed.

In recent years, there have been appeared liners sensors which contact the surface of a document closely to read its image. Such a close contact type of sensor may be a structure to which the following are incorporated in a body: a lens for taking in an image on a document, a light receiving section on which the image light taken in by the lens forms an image to convert the optical image into an electric signal corresponding to the quantity of the light, in every pixel unit, and a luminous element for radiating light onto the surface of the document. Such a sensor may be used.

Figure 15:
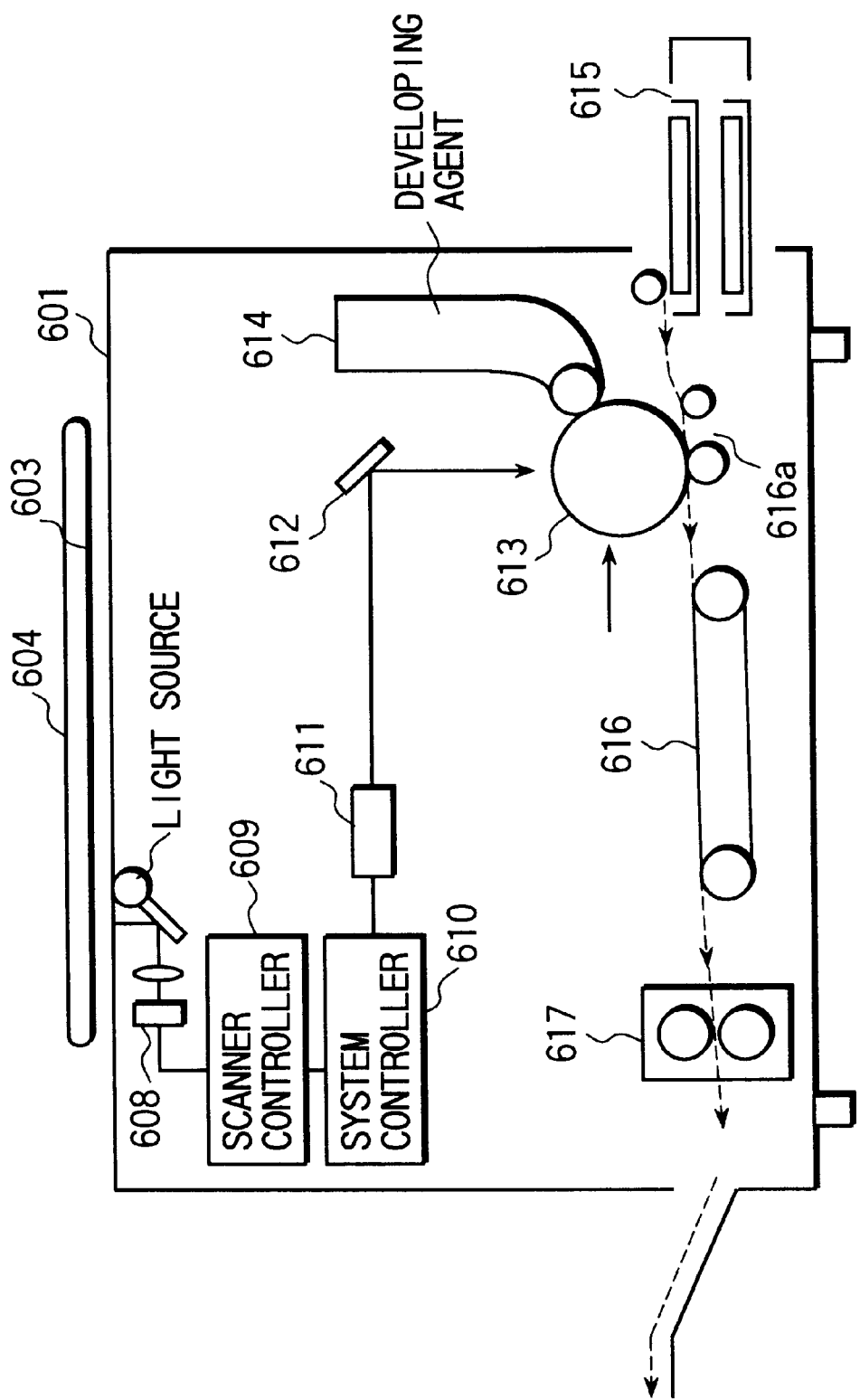
FIG. 15 is a view illustrating an embodiment of a plain paper copier using a MOS sensor according to the present invention.

The following will describe an embodiment wherein an amplifying MOS sensor is applied to a copy machine. FIG. 15 illustrates an embodiment of a plain paper copier using a MOS sensor according to the present invention.

FIG. 15 shows a principle structure thereof. A document holder 602 made of glass or the like is disposed at the upper face of a case 601. A document 603 in a sheet form, for example, a document wherein an image is handwritten or printed on paper, or a photograph is set on the document holder 602 and then the document is pressured with a holding cover 604.

In the case 601, an optical system is disposed near the position just under the document holder 602 to be repeatedly moved between one end of the document holder 602 and the other end thereof at a constant speed. The repeatedly movable direction is referred to as a main scanning direction, herein. The optical system 605 comprises a rod-like light source 605, a mirror 606 and a lens 607. The light source 605 is arranged in the direction crossing the main scanning direction at right angles. (The direction is referred to as a sub-scanning direction.)

A MOS sensor 608 is arranged at the position where an image is formed with the lens 607. The MOS sensor 608 is a linear sensor wherein light receiving bodies for respective pixel units (photodiodes) are arranged in a one-dimensional form, and is a monochrome solid-state image sensor according to the present invention.

An image corresponding to every line in the subscanning direction is formed on the MOS sensor 608, and the image is converted into electric signals corresponding to the quantity of received light. A scanner controller 609 controls the MOS sensor 608 so that in the order that pixels are arranged, the sensor 608 reads an image signal corresponding to the quantity of received light for every pixel and outputs the signal and controls the movement in the main scanning direction of the optical system so that the optical system can be successively moved in the main scanning direction. A system controller 610 controls the whole of the system, and also controls the output of a laser source 611 on the basis of the signal corresponding to the quantity of received light outputted from the MOS sensor 608. The laser source 611 generates a laser beam in a spot form. The laser beam generated by the laser source 611 is reflected on a polygon mirror 612, which is a scanning mirror for scanning the laser beam, to form an image on a photosensitive drum 613 in a cylindrical form. The position where the image is formed is a plotting position. The photosensitive drum 613 is rotated in one direction at a constant speed, and becomes charged at the upstream of the position irradiated with the laser beam (at the upstream of the plotting position) by means of a charging device not illustrated.

On the basis of the control by the system controller 610, the polygon mirror 612 scans the spot laser beam on the surface of the cylindrical photo-sensitive drum 613, correspondingly to the output speed of the signals from the MOS sensor 608. The laser beam is scanned in the direction perpendicular to the rotation direction of the photosensitive drum 613, which is referred to as a main scanning direction, so that the charge is lost correspondingly to the quantity of light of the laser beam. Thus, a latent image corresponding to the image on the document is formed. When the photosensitive drum 613 passes at the position where a developer 614 for turning the latent image into a visible image is located at the downstream of the plotting position, the latent image at that position is developed with toner provided by the developer 614 to be turned into a visible image. The toner image is transferred onto a paper which is taken out one by one from a storage tray 615 for papers and is carried to a carrier path 616 below the lower side face of the photosensitive drum 613.

The carrying speed of the paper and the rotation speed of the drum 613 are synchronized. Thus, the same toner image as the image on the document remains on the paper by transferring the toner image generated from the latent image formed by plotting one line by one line on the surface of the photosensitive drum 613. The carrier path 616 is a path for carrying the paper onto which the toner image is transferred to a carrying-out opening, and the paper is carried by a carrying mechanism disposed at the carrier path 616. A fixer 617 is a device for fixing toner which is disposed before the carrying-out opening. When the paper onto which the toner image is transferred passes through the fixer 617, the toner is fixed on the paper and the paper is fed out to the carrying-out opening.

In making a copy in this structure, a document 603 in a sheet form is set on the upper face of the document holder 602, and then is pressed with the holding cover 604. Since the optical system is disposed near the position just under the document holder 602 to be repeatedly moved in the main scanning direction between one end of the document holder 602 and the other end thereof at a constant speed, the optical system comprising the light source 605, the mirror 606 and the lens 607 is repeatedly shifted in the main scanning direction when printing start operation is performed.

When the main scanning direction is regarded as a longitudinal direction, the lateral direction of the document holder 602 is defined as a width direction. In this case, the light source 605 in the optical system illuminates the range corresponding to the width of the document holder 602, and the image light from the illuminated range forms an image on the light receiving face of the MOS sensor 608 by means of the mirror 606 and lens 607 in the optical system. The MOS sensor 608 is a linear sensor wherein light receiving bodies for respective pixel units (photodiodes) are arranged in a one-dimensional form, and is a monochrome solid-state image sensor according to the present invention.

Thus, an image corresponding to every line in the width direction, that is, sub-scanning direction is formed on the MOS sensor 608, and the image is converted into electric signals corresponding to the quantity of received light. The scanner controller 609 controls the MOS sensor 608 so that in the order that pixels are arranged, the sensor 608 outputs an image signal corresponding to the quantity of received light for every pixel. The scanner controller 609 also controls the movement in the main scanning direction of the optical system so that the optical system can be successively moved in the main scanning direction. For this reason, from the image on the document 603 set on the document holder 602, over the whole of the main scanning direction the signals corresponding to the quantity of received light are obtained in the order of pixels in every line unit along the sub-scanning direction.

The signals are provided to the system controller 610, and then the system controller 610 controls outputs from the laser source 611, correspondingly to the provided signals. Therefore, the laser source 611 emits a laser beam having a strength dependent on the signal corresponding to the quantity of received light, the signal being outputted from the MOS sensor 608.

On the contrary, the system controller 610 controls the polygon mirror 612 to be moved in such a manner as one's head is shaken, in synchronization with the speed of reading the MOS sensor 606. Thus, an optical image corresponding to the image in one line (i.e., in one line along the sub-scanning direction) is plotted on the photosensitive drum 613 with the polygon mirror 612.

The photosensitive drum 613 is rotated in a constant direction at the rotation speed corresponding to the main scanning speed. When a given position of the peripheral face of the photosensitive drum 613 reaches the position wherein an image can be plotted through the polygon mirror 612 with a laser beam, the peripheral face is charged. When the photosensitive body 613 is irradiated with the laser beam, the charge on the portion irradiated with the laser is lost in the amount corresponding to the quantity of received laser light. Therefore, the image from the document, as a latent image, remains at the downstream, along the rotation direction, of the position for plotting with the laser beam via the polygon mirror 612 on the photosensitive drum 613.

When the latent image passes at the position where the developer 614 is disposed, the latent image is developed with toner provided by the developer 614 to be turned into a visible image. The toner image is transferred onto a paper which is taken out one by one from a storage tray 615 for papers and is carried to a carrier path 616 below the lower side face of the photosensitive drum 613. The carrying speed of the paper and the rotation speed of the drum 613 are synchronized. Thus, the same toner image as the image on the document remains on the paper by transferring the toner image generated from the latent image formed on the surface of the photosensitive drum 613 by plotting one line by one line. The paper onto which the toner image is transferred is carried through the carrier path 616 to the carrying-out opening by a carrying mechanism. When the paper passes through the fixer 617 disposed before the carrying-out opening, the toner is fixed on the paper and is fed out to the carrying-out opening.

According to the present invention, a compact plain paper copier can be obtained which makes it possible to reduce the electric power and voltage to be consumed and realize a high-speed reading with a high S/N ratio and which has high function and performance. Namely, it is possible to provide a plain paper copier wherein a high quality image with a high sensitivity, a low degree of color crosstalks and a good S/N ratio can be read at a high-speed and reproduced at a high-speed.

In the aforementioned copier, the position of a document is fixed and the optical system is shifted in the main scanning direction, but the present invention may be applied to a copier which has a structure wherein the position of the optical system is fixed and a document is fed in the main scanning direction. The aforementioned copier relates to a monochrome device, but the present invention may be applied to a copier wherein filters of the three primary colors are fitted to the optical system to decompose colors, and an latent image for every color is formed to be developed with toner of a corresponding color, thereby obtaining a color copy.

Figure 16:
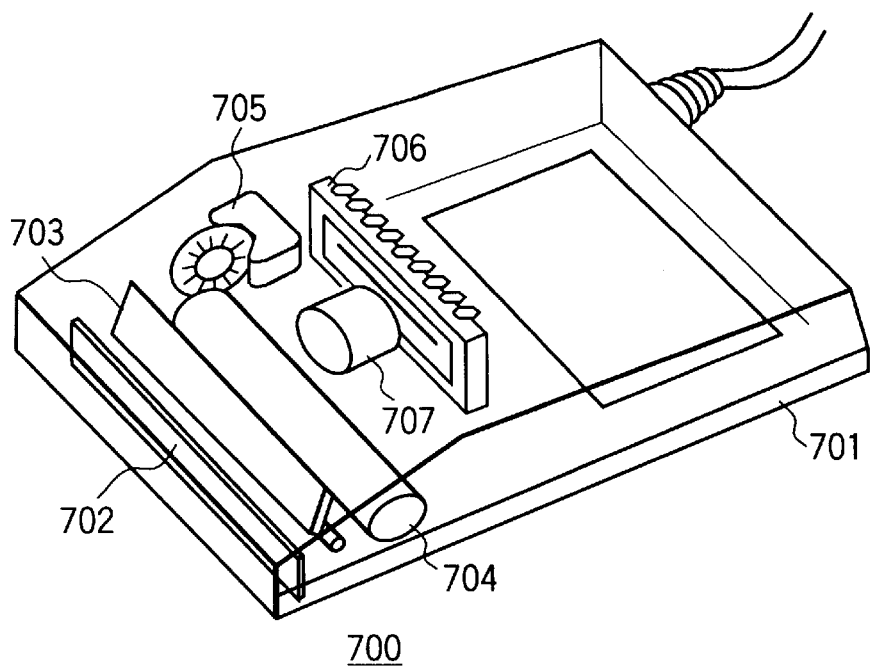
FIG. 16 is a view illustrating an embodiment of a handy image scanner using a MOS sensor according to the present invention.

The following will describe an embodiment wherein an amplifying MOS sensor is applied to a handy image scanner. FIG. 16 illustrates an embodiment of a handy image scanner using a MOS sensor according to the present invention.

As shown in FIG. 16, the image scanner 100 according to the present invention has a structure wherein an LED array 702 which is a light source, a mirror 703 and a roller 704 are fitted to the inside of a case 701. The LED array 702 has a length over substantially the whole of the lateral width of the case 701, and illuminates the lower outside of the case 701. The mirror 703 is disposed near the position where the LEC array 702 is arranged, so as to take in the image on the document irradiated with the LED array 702, through a slit 701a positioned at the lower portion of the case 701, inside the case 701.

The case 701 of the handy scanner in FIG. 16 is put on the document, and then is moved and scanned so as to be slid on the document by one's hand. At that time, in order to take in the image on the document in every line unit from the slit 701a, the roller 704 for synchronizing detection of the line position with reading is disposed. A part of the peripheral face of the roller 704 is exposed to the outside from the lower portion of the case 701 to contact the document and be rotated by friction between the part and the document. The position for the exposure is near the slit 701a.

Inside the case 701, an encoder 705 is arranged which is synchronized with the rotation of the roller 704 to detect its rotation direction and amount. Inside the case 701, there are disposed a MOS sensor 706 and a lens 707 for forming an image on the light receiving face of the MOS sensor 706 by light introduced through the mirror 703 from the document.

The MOS sensor 706 is a linear sensor wherein light receiving bodies for respective pixel units (photodiodes) are arranged in a one-dimensional form, and is a monochrome solid-state image sensor according to the present invention. At present, many of the liners sensors are a close contact type which contacts the surface of a document closely to read its image.

Such a close contact type of sensor may be realized by a structure into which the following are incorporated in a body: a lens for taking in an image on a document, a light receiving section on which the image light taken in by the lens forms an image to convert the optical image into an electric signal corresponding to the quantity of the light, in every pixel unit, and a luminous element for radiating light onto the surface of the document. Such a sensor may be used.

To explain the principal, the structure in FIG. 16 is shown herein.

The signal read from the MOS sensor 706 is matched to the position where the signal is read, by the output from the encoder 705, and is used for controlling reading timing.

In this structure, a document in a sheet form is put on a flat place, and then the handy scanner is put thereon and shifted on the document in the direction that the roller 704 can be rotated. This sift direction is a main scanning direction. At that time, the surface of the document is irradiated with the LED array 702, so that the image light from the document is introduced through the slit 701a to the mirror 703. The light is reflected on the mirror 703 and further goes through the lens 707 to form an image on the MOS sensor 706.

The MOS sensor 706 is a line image sensor. On the light receiving face of the fixed MOS sensor 706, the image light from the document goes through the lens 707 to form an image one line by one line. The formed image is read by the MOS sensor 706.

In this manner, the case 701 of the handy scanner in the present embodiment is put on the document and then the scanner is shifted as it is by one's hand to be slid on the document. At that time, in order to take in the image, in every line unit, through the slit 701a from the document, the roller for synchronizing detection of the line position with reading is disposed. This roller 704 contacts the document and is rotated by the friction between the roller 701 and the document, so that the encoder 705 outputs signals corresponding to the rotation direction and the rotation amount. On the basis of the detection signals from the encoder 705, a control means not illustrated controls the signals outputted from the MOS sensor 706 so as to correspond to every line, and outputs the controlled signals.

According to the present invention, a compact image scanner can be obtained which makes it possible to reduce the electric power and voltage to be consumed and realize a high-speed reading with a high S/N ratio and which has high function and performance. Namely, it is possible to provide an image scanner wherein a high quality image with a high sensitivity, a low degree of color crosstalks and a good S/N ratio can be read at a high-speed.

The present embodiment relates to a handy image scanner, but the present invention may be applied to a desktop image scanner in which a document is put on a document holder and then an optical system is shifted in the main direction; or a device in which the position of an optical system is fixed and a document is fed in the main scanning direction. The aforementioned image scanner relates to a monochrome device, but the present invention may be applied to an image scanner wherein filters of the three primary colors are fitted to the optical system so as to decompose colors, and an image signal for every color is obtained to gain a signal for a color image. Various variation may be used wherein a concave lens is used to form the optical system, and an image is introduced onto the MOS sensor through the concave lens, or wherein an image is introduced onto the MOS sensor through an optical fiber cable composed of a bundle of optical fibers.

Figure 17:
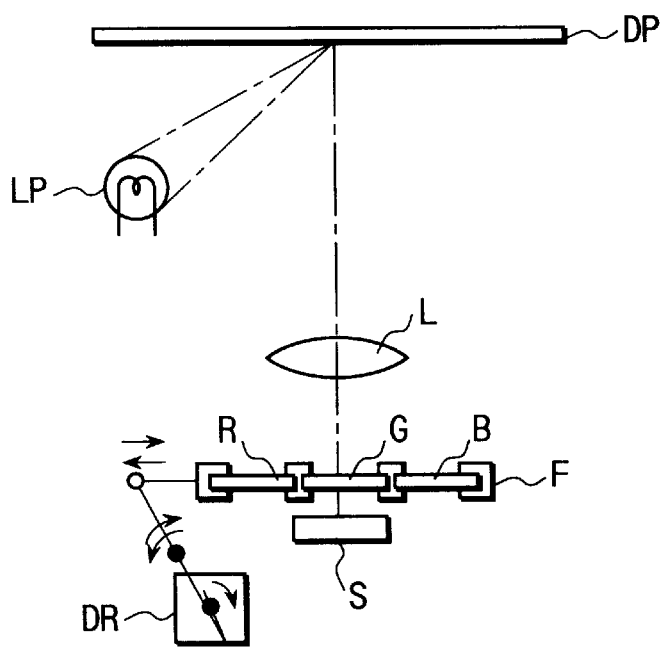
FIG. 17 is a view illustrating an example of a structure of an amplifying MOS sensor using a color filter which can be mechanically shifted.

The following will describe an embodiment wherein an amplifying MOS sensor is applied to a desktop image scanner. FIG. 17 illustrates an embodiment of a desktop image scanner using a MOS sensor according to the present invention.

In the desktop image scanner, an optical system is fixed on a specified position, and a document is scanned in the main scanning direction. In this case, color filters of the three primary colors are fitted to the optical system to decompose color and obtain an image signal of each of colors, as shown in FIG. 17. In FIG. 17, a MOS sensor S for obtaining image signals is a line sensor, and is composed of pixels arranged correspondingly to one line. A color filter F is located at the light receiving face side of the MOS sensor S. In the color filter F, an optical filter portion for each of color components R(red), G(green), and B(blue) having a width and a length corresponding to one line is arranged in a line. The image light from a document DP forms an image, through a lens L, and the color filter F, on the light receiving face of the MOS sensor S. The document DP is irradiated with light from a light source LP.

The color filter F is movably supported by a moving scanning mechanism DR so that the optical filter portion for each of color components R(red), G(green), and B(blue) can be moved above the light receiving face of the MOS sensor S. When light is received from a red image, a green image or a blue image, the color filter F is controlled and moved in synchronization with the timing of collecting the image, so that the optical filter portion for the R color component, for the G color component or for the B color component is positioned above the light receiving face of the MOS sensor S, respectively.

This makes it possible to obtain an image signal for each of the color components R(red), G(green), and B(blue) from the MOS sensor.

The following will describe an embodiment wherein an amplifying MOS sensor is applied to a film scanner device. The amplifying MOS sensor according to the invention scanner device for reading, for example, a 35 mm long film one frame by one frame to obtain an image signal and supply it into a personal computer, an image display device or the like. An example of such a film scanner is shown in FIG. 18.

Figure 18:
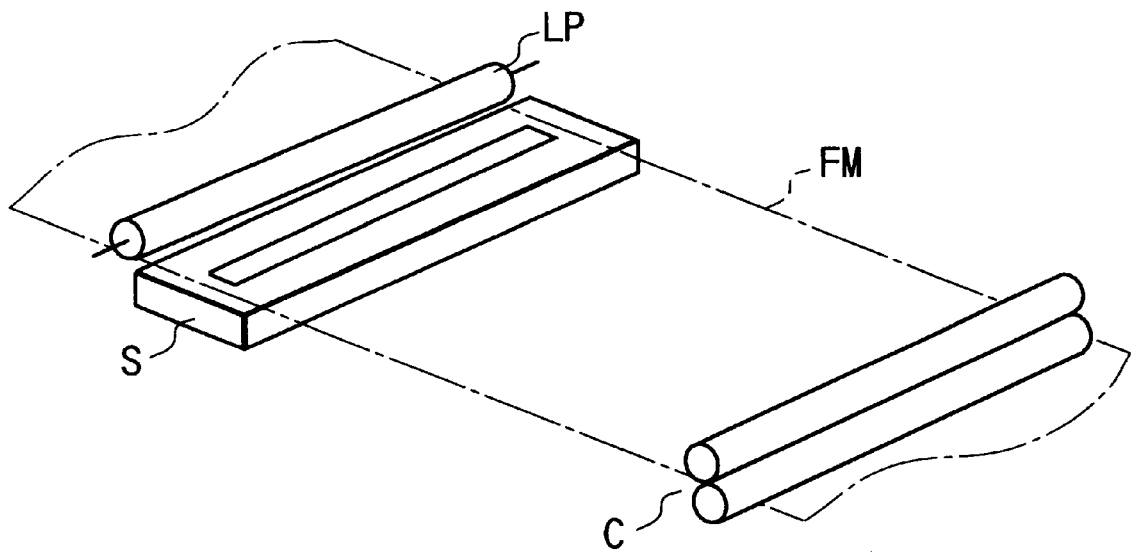
FIG. 18 is a view for explaining a film scanner to which an amplifying MOS sensor according to the present invention is applied.

As illustrated in FIG. 18, the film scanner has a close contact type of line sensor S composed of an amplifying sensor, a developed silver salt long film FM set at the light receiving face side of the line sensor S, a light source LP for illuminating the silver salt long film FM over the light receiving face of the line sensor S, and a pair of carrying rollers C for sandwiching the silver salt long film FM to carry it in a constant direction at a constant speed.

According to this structure, the carrying rollers C sandwiching the silver salt long film FM is rotated at a constant speed, so that the film FM is carried in one direction at a constant speed. Therefore, the close contact type of line sensor S reads the image on the film FM in synchronization with the film carrying speed to obtain signals corresponding to the quantity of received light. The film image composed of only image components can be converted into electric signals, in every line unit, and outputted.

Figure 19:
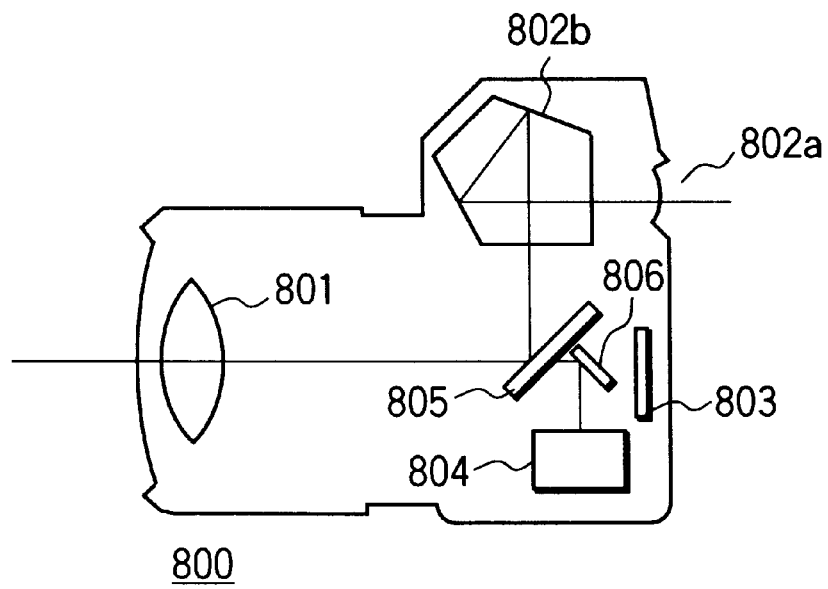
FIG. 19 is a view illustrating a single-lens reflex camera with an auto-focus mechanism using a MOS sensor according to the present invention.

The following will describe an embodiment wherein an amplifying MOS sensor is applied to au auto-focus mechanism. FIG. 19 illustrates an embodiment of a single-lens reflex camera with an auto-focus mechanism using a MOS sensor according to the present invention.

In FIG. 19, the single-lens reflex camera 800 according to the invention has a lens 801 with a focus adjusting mechanism, a film 803 on which the image light through the lens 801 forms an image so that the film is exposed to the light, a prism 802b for introducing the optical image through the lens 801 onto a finder 802a, an auto-focus sensor module 804 according to the invention, and a half-mirror, a jumping type of finder mirror 805 which can be positioned at the light path from the lens 801 and taken off from the light path by shuttering operation, and a submirror 806 which is fixed on the back side of the finder mirror 805 and makes the light of the optical image which has penetrated through finder mirror 805 form an image on the auto-focus sensor module 803 when the finder mirror 805 is positioned at the light path from the lens 801.

As the auto-focus sensor module 804, the MOS sensor according to the invention is used. As shown in FIGS. 20A to 20C, separator lenses 804b are fixed onto the camera before the light receiving face of the MOS sensor 804a. As the mOS sensor 804a, a sensor having a light receiving face in a two-dimensional array from is used. As shown in FIGS. 20A to 20C, the separator lenses 804b have a pair of convex lenses arranged in a line. The light of the optical image distributed by the submirror 806 forms images on different areas on the light receiving face of the MOS sensor 804a, respectively, by means of the separator lenses 804b. The optical image is introduced on the light receiving face of the MOS sensor 804a by the separator lenses 804a wherein the pair of convex lenses are arranged in a line, so that respective images are formed on the different areas on the light receiving face, thereby obtaining a pair of images.

In the camera having this structure, light of the image of an object caught by the lens 801 is distributed to the prism 802b and the submirror 806 by the finder mirror 805. The light of the image of the object distributed by the finder mirror 805 goes through the prism 802b and forms an image on the finder 802a, so that the image of the object caught by the camera 800 can be observed.

The light of the image of the object distributed to the submirror 806 is introduced to the auto-focus sensor module 804. The module 804 is composed of the MOS sensor 804a, and the separator lenses 804b are arranged before the light receiving face of the MOS sensor 804a. The separator lenses 804b cause images to form on different areas on the light receiving face of the MOS sensor 804a. The MOS sensor 804a generates an electric signal corresponding to the quantity of the light of the optical image which is formed on each of the photodiodes which constitute the light receiving face and correspond to respective pixels. The generated signals are read in turn.

In the auto-focus sensor module 804, in fact the light receiving face of the MOS sensor 804a is separated into two image-forming areas by the separator lenses 804b. When just focusing for the images based on the object which are formed on the two image-forming areas are attained, the outputs based on the same images are provided from the MOS sensor 804a, centering on basic pixel points PO and PO' for the respective separated image-forming areas, as shown in reference number 806A in FIG. 20A.

In the case of forward defocusing, i.e., the state that the focus is shifted forward from the film surface, the outputs based on the same images are provided from the MOS sensor 804a, to the positions close to each other inside the basic pixel points PO and PO' for the respective separated image-forming areas as shown in reference number 806B in FIG. 20A.

In the case of rear defocusing, i.e., the state that the focus is shifted backward from the film surface, the outputs based on the same images are provided from the MOS sensor 804a, to the positions apart from each other outside the basic pixel points PO and PO' for the respective separated image-forming areas as shown in reference number 806C in FIG. 20A.

From the output from the MOS sensor 804a, therefore, a control amount is obtained which is necessary for adjusting the focus position into the state that the outputs based on the same images are provided from the MOS sensor 804a, centering on basic pixel points PO and PO' for the respective separated image-forming area. The focus position adjusting mechanism is controlled so as to correspond to the aforementioned control amount. Thus, the focus of the lens 801 is adjusted to be just focused on the surface of the film.

When shuttering operation is carried out, the finder mirror 805 is jumped to be taken off from the light path. Thus, the light of the image of the object caught by the lens 801 forms an image on the film surface so that the film is exposed to the light. As a result, a just focused photographic image of the object is taken.

In the camera with an auto-focus mechanism according to the present invention, it is possible to reduce the electric power and voltage to be consumed for detecting a focus state and realize a high-speed reading with a high S/N ratio. Thus, when taking a photograph at a high shutter speed or photographs successively at a high-speed, the focus state can be detected satisfactorily, and the focus position can be adjusted immediately so as to obtain vivid images. Namely, it is possible to read a high quality image with a high sensitivity, a low degree of color crosstalks and a good S/N ratio, at a high-speed, and detect the focus state at a high-speed. As a result, it is possible to control the focus position immediately and obtain vivid photographic images.

The aforementioned embodiment relates to a single-lens reflex camera, but the auto-focus mechanism using the present invention may be applied to a lens shutter camera, filed glasses and an optical microscope.

In the amplifying MOS-type solid-state image sensor, respective output signals from photodiodes which are a light receiving section and correspond to pixels in respective unit cells are generally amplified and taken out through respective transistors fitted to the respective unit cells. Therefore, in amplifying the signals, the scattering in threshold voltages of the respective transistors effects on the signals. Thus, even if the voltages at the respective photodiodes in the respective cells are the same, the output signals from them are not the same because the amplifying transistors fitted to the unit cells having the respective photodiodes are different and the threshold voltages of the respective amplifying transistors are also different. For this reason, when images taken with an amplifying MOS-type solid-state image sensor are reproduced, noises are generated which correspond to the disperse in the threshold values of the amplifying transistors in the respective cells.

As described above, in the amplifying MOS-type solid-state image sensor, the thresholds of the amplifying transistors fitted to the respective unit cells are different and are peculiar in the respective cells; therefore, it is not avoidable that noises distributed to fixed positions, that is, a two-dimensional noises are arisen in reproduced images. The noises are called fixed pattern noises since they are locally fixed.

In the present invention, a noise chancellor may be disposed to remove off the fixed pattern noise.

The present invention is not limited to the aforementioned embodiment, and can be modified within the claimed scope.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a solid-state image sensor, which comprises a plurality of photoelectric conversion sections formed within respective isolated active regions on a semiconductor substrate; an image pick-up area wherein unit cells, comprising said plurality of photoelectric conversion sections and a signal scanning circuit, are arranged in a two-dimensional array; and signal lines for reading signals from the respective unit cells within the image pick-up area, said method comprising:

forming a plurality of photoelectric conversion sections by at least two ion implantation steps, ions used in said at least two ion implantation steps having a same conductivity type.

2. The method of manufacturing a solid-state image sensor according to claim 1, further comprising:

forming an upper portion and a lower portion for each of said plurality of photoelectric conversion sections, said upper portion having an area larger than said lower portion.

3. The method of manufacturing a solid-state image sensor according to claim 1, further comprising:

forming an insulator element configured to isolate said active regions.

4. The method of manufacturing a solid-state image sensor according to claim 1, wherein forming the plurality of photoelectric conversion sections by at least two ion implantation steps is performed by implanting ions at different energies.

5. A method of manufacturing a photodiode in a solid-state device, comprising:

a first implantation step of implanting ions of a conductivity type in a layer so as to form an upper portion of said photodiode, said upper portion having a first width; and a second implantation step of implanting ions of a same conductivity type in said layer so as to form a lower portion of said photodiode, said lower portion having a second width, wherein said first and second implantation steps are performed so that said first width is larger than said second width.

6. The method of claim 5, wherein:

the second implantation step is performed at a higher energy than that of said first implantation step.

7. The method of claim 5, wherein:

the second implantation step is performed at a lower exposure than that of said first implantation step.

8. The method of claim 5, further comprising the step of annealing said photodiode.

* * * * *